United States Patent
Hatakeyama et al.

(10) Patent No.: US 6,919,161 B2
(45) Date of Patent: Jul. 19, 2005

(54) SILICON-CONTAINING POLYMER, RESIST COMPOSITION AND PATTERNING PROCESS

(75) Inventors: Jun Hatakeyama, Niigata-ken (JP); Takanobu Takeda, Niigata-ken (JP); Toshinobu Ishihara, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/611,261

(22) Filed: Jul. 2, 2003

(65) Prior Publication Data

US 2004/0013980 A1 Jan. 22, 2004

(30) Foreign Application Priority Data

Jul. 2, 2002 (JP) .................................... 2002-192910

(51) Int. Cl.$^7$ .............................................. G03F 7/004
(52) U.S. Cl. .................... 430/270.1; 430/311; 252/500; 524/262
(58) Field of Search ............................. 430/270.1, 311; 252/500; 524/262

(56) References Cited

U.S. PATENT DOCUMENTS

| | | | |
|---|---|---|---|
| 4,491,628 A | 1/1985 | Ito et al. | |
| 5,310,619 A | 5/1994 | Crivello et al. | |
| 6,492,089 B2 | 12/2002 | Hatakeyama et al. | |

FOREIGN PATENT DOCUMENTS

| | | | |
|---|---|---|---|
| JP | 63-27829 A | 2/1988 | |
| JP | 2-27660 B2 | 6/1990 | |
| JP | 5-158239 A | 6/1993 | |
| JP | 5-232706 A | 9/1993 | |

(Continued)

OTHER PUBLICATIONS

English language translation of JP 2000-212305.*
International Work Shop 157nm Lithography MIT–LL, Boston, MA, May 5, 1999.
J. Vac. Sci. Technol. B17(6), Nov./Dec. 1999.
J. Photopolymer Sci. and Technol., Vo. 13, No. 4 (2000), pp. 657–664 and pp. 451–458.
SPIE vol. 1925 (1993), p. 377.
J. Photopolymer Sci. and Technol., vol. 9, No. 3 (1996), ppg. 435–446.
SPIE vol. 3678, (1999), pp. 214, 241 and 562.
SPIE vol. 3678, (1999), p. 420.
Proc. SPIE, vol. 1262, p. 110 (1990).
Proc. SPIE, vol. 1466, p. 520 (1991).

Primary Examiner—Amanda Walke
(74) Attorney, Agent, or Firm—Birch, Stewart, Kolasch & Birch, LLP

(57) ABSTRACT

Silicon-containing polymers comprising recurring units of formula (1) are novel wherein $R^1$ is a single bond or alkylene, $R^2$ is hydrogen or alkyl, $R^3$, $R^4$ and $R^5$ are alkyl, haloalkyl, aryl or silicon-containing group, $R^6$ is hydrogen, methyl, cyano or —C(=O)OR$^8$ wherein $R^8$ is hydrogen, alkyl or acid labile group, $R^7$ is alkyl, —NR$^9$R$^{10}$ or —OR$^{11}$ wherein $R^9$, $R^{10}$ and $R^{11}$ are hydrogen or alkyl, a and b are positive numbers satisfying $0<a+b\leq 1$. Resist compositions comprising the polymers are sensitive to high-energy radiation and have a high sensitivity and resolution at a wavelength of less than 300 nm and improved resistance to oxygen plasma etching.

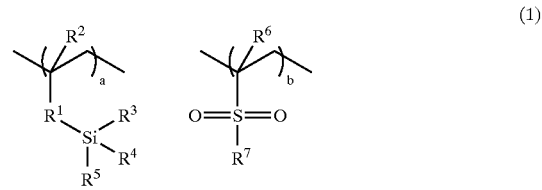

(1)

19 Claims, 2 Drawing Sheets

FOREIGN PATENT DOCUMENTS

| | | | |
|---|---|---|---|
| JP | 5-249662 A | 9/1993 |
| JP | 5-249683 A | 9/1993 |
| JP | 5-257282 A | 10/1993 |
| JP | 5-289322 A | 11/1993 |
| JP | 5-289340 A | 11/1993 |
| JP | 6-118651 A | 4/1994 |
| JP | 9-73173 A | 3/1997 |
| JP | 9-110938 A | 4/1997 |
| JP | 9-230595 A | 9/1997 |
| JP | 10-10739 A | 1/1998 |
| JP | 10-324748 A | 12/1998 |
| JP | 11-302382 A | 11/1999 |
| JP | 2000212305 A * | 8/2000 | ............ C08J/5/22 |
| JP | 2001-158808 A | 6/2001 |
| JP | 2002-256033 A | 9/2002 |
| JP | 2002-348332 A | 12/2002 |
| WO | WO 97/33198 A1 | 9/1997 |

* cited by examiner

SILICON-CONTAINING POLYMER, RESIST COMPOSITION AND PATTERNING PROCESS

This invention relates to silicon-containing polymers suitable as the base resin in resist compositions, especially chemically amplified positive resist compositions used for micropatterning in a process for the fabrication of semiconductor devices. It also relates to resist compositions, especially chemically amplified positive resist compositions adapted for exposure to high-energy radiation such as deep-UV, KrF excimer laser light (248 nm), ArF excimer laser light (193 nm), $F_2$ laser light (157 nm), electron beams or x-rays, and a process for forming a pattern.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF excimer laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have attempted test fabrication on the 0.15 micron rule and started investigation on the 0.13 micron rule, with the trend toward a finer pattern rule being accelerated. A wavelength change-over from KrF to shorter wavelength ArF excimer laser (193 nm) is expected to enable miniaturization of the design rule to 0.13 $\mu$m or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 $\mu$m or less, more difficulty arises in insuring transparency because it was found that acrylic resins are not transmissive to light at all and those cycloolefin resins having carbonyl bonds have strong absorption. Polymers having benzene rings have a somewhat improved transmittance in proximity to 160 nm wavelength, which is far below the practically acceptable level. It was found that in single layer resists, reducing carbon-to-carbon double bonds as typified by benzene rings and carbon-to-oxygen double bonds as typified by carbonyl groups is essential for insuring a light transmittance (see International Work Shop 157 nm Lithography MIT-LL, Boston, Mass., May 5, 1999). It was reported in J. Vac. Sci. Technol., B17(6), November/December 1999 that introduction of fluorine is effective to improve transmittance. A number of fluorinated polymers for resist compositions were proposed (see J. Photopolymer Sci. and Technol., Vol. 13, No. 4 (2000), pp. 657–664 and pp. 451–458). However, the transmittance of these polymers does not reach that of polyhydroxystyrene and derivatives thereof adapted for KrF exposure and poly(meth)acrylic derivatives and polycycloolefin derivatives adapted for ArF exposure.

As is known in the art, the bi-layer resist method is advantageous in forming a high-aspect ratio pattern on a stepped substrate. It is also known that in order that a bi-layer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see JP-A 6-118651 and SPIE vol. 1925 (1993), p. 377). Positive resist compositions comprising as a base a silsesquioxane of the type in which cyclohexylcarboxylic acid is substituted with an acid labile group were proposed for ArF exposure (see JP-A 10-324748, JP-A 11-302382, and SPIE vol. 3333-07 (1998), p. 62). Also proposed were silicone-containing polymers prepared from silicon-containing acrylic monomers (see JP-A 9-110938, J. Photopolymer Sci. and Technol., Vol. 9, No. 3 (1996), pp. 435–446).

The silicon-containing polymer of the acrylic pendant type has the drawback that its resistance to dry etching with oxygen plasma is weak as compared with the silsesquioxane polymer. A low silicon content and a different polymer main skeleton account for this weak dry etching resistance. The siloxane pendant type polymer has the other drawback of poor developer wetting that it is likely to repel a developer solution. SPIE vol. 3678, pp. 214, 241 and 562 describes a polymer derived from a monomer of the trisilane or tetrasilane pendant type having an increased silicon content and a silicon-containing substituent which can be eliminated with acid. However, since di- and polysilane compounds exhibit strong absorption at a wavelength of less than 200 nm, an increased introduction of such silanes undesirably leads to a lower transmittance. Besides, an attempt of introducing silicon into acid labile groups is reported in SPIE vol. 3678, p. 420. Because of a low acid elimination ability, there are drawbacks including low environmental stability and a T-top profile.

The applicant/assignee proposed in U.S. Pat. No. 6,492, 089 (based on Japanese Patent Application No. 11-342380), an acid labile group in the form of a cyclic hydrocarbon group having silicon introduced therein. This polymer has the advantages of an improved acid elimination ability and prevention of T-top profiling and allows dry etching resistance to be enhanced by introducing two or more silicon atoms in a single cyclic hydrocarbon group. A concern about a loss of transmittance to ArF exposure is eliminated.

The serious drawback of acrylic pendant type silicon-containing polymers is a low glass transition temperature (Tg). Since chemically amplified resist compositions are designed such that elimination reaction of acid labile groups is induced by post-exposure baking (PEB), the polymer should have a Tg equal to or above the baking temperature. The PEB temperature is usually 80 to 150° C., and a Tg of about 150° C. is necessary. If PEB is performed above the Tg of the polymer, the acid diffuses through the thermally flowing polymer, losing control on pattern dimensions after development.

Another drawback of the acrylic pendant type silicon-containing polymers is that when observed under a critical dimension measurement SEM, line dimensions are reduced during measurement. This is because ester groups are cleaved by irradiation of electron beams and the resulting ester end moieties volatilize off. A further drawback is slimming of a resist film upon exposure to a $F_2$ laser. This is also because volume shrinkage occurs as a result of ester groups being cleaved by irradiation of VUV laser beams. It is pointed out that when a polymer having silicone-pendant ester groups is irradiated with VUV laser beams, silicone compounds can volatilize out of the polymer. The volatilized silicone compounds will deposit on the surface of a projection lens, leading to a transmittance decline. It is reported that deposits of silicone compounds are difficult to remove as compared with hydrocarbon deposits.

We then presumed that the above-discussed problem can be solved by a resist composition comprising a polymer obtained by polymerizing a vinylsilane or allylsilane derivative having silicone pendent from unsaturated bonds for polymerization, rather than the ester pendant.

In the prior art, for a monomer having a silicon pendant from an unsaturated bond such as vinylsilane, neither radical polymerization of the monomer alone nor copolymerization of the monomer with norbornene or acrylic monomers is possible.

The copolymerization of allylsilane with maleimide is reported in Proc. SPIE, Vol. 1262, p. 110 (1990), and the copolymerization thereof with maleic anhydride reported in Proc. Society of Plastics Engineers Inc., Mid-Hudson Section, 1991, 1466, 227. Unfortunately, these copolymers are less resistant to etching because allylsilane contains only one silicon.

Aiming to increase the silicon content, we synthesized vinyl and allyl compounds having cyclic siloxane of at least three silicon atoms on a side chain and copolymerized them with maleic anhydride to form polymers which had enhanced etching resistance (see Japanese Patent Application No. 2001-056536 and No. 2001-056543 or U.S. Ser. No. 10/085,935). As opposed to chain-like siloxanes generally having low Tg and allowing expansion of acid diffusion, cyclic siloxanes have the advantages that Tg decline is limited and acid diffusion is controlled minimum. It is well known in Proc. SPIE, Vol. 1466, p. 520 (1991) that vinylsilane and allylsilane copolymerize with sulfur dioxide. However, polymers of sulfur dioxide are used in electron beam resists of the backbone decomposition type and characterized in that they are readily cleaved upon exposure to light, plasma or electron beams. A phenomenon that lines are slimmed upon exposure to electron beams during SEM observation was ascertained. It was also found that the sulfur dioxide polymers are less resistant to oxygen plasma etching.

SUMMARY OF THE INVENTION

An object of the invention is to provide a novel silicon-containing polymer which is useful as the base polymer in a resist composition, especially a chemically amplified positive resist composition, having a high sensitivity and high resolution, especially suitable as a material for use in the bi-layer resist method adapted to form a high-aspect ratio pattern, and capable of forming a pattern having improved heat resistance. Another object of the invention is to provide a resist composition, especially a chemically amplified positive resist composition, comprising the polymer as the base resin, and a method for forming a resist pattern using the same.

We have found that a polymer comprising recurring units of the general formula (1), shown below, has an increased silicon content, especially when units of the general formula (2), shown below, are included, and that a resist composition, especially a chemically amplified positive resist composition, using the polymer as a base resin has a high sensitivity and high resolution, is especially suitable as a material for use in the bi-layer resist method adapted to form a high-aspect ratio pattern, and can form a pattern having improved heat resistance. Since the copolymer of the invention has sulfone on a side chain, the backbone is not fragmented even in the event of cleavage of the sulfone moiety. This avoids line slimming during SEM observation and ensures etching resistance. The present invention is predicated on this finding.

In a first aspect, the invention provides a silicon-containing polymer comprising recurring units of the general formula (1):

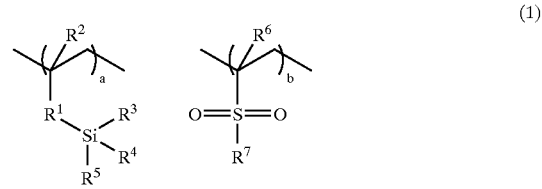

(1)

Herein $R^1$ is a single bond or a straight, branched or cyclic alkylene group of 1 to 10 carbon atoms; $R^2$ is hydrogen or a straight, branched or cyclic alkyl group of 1 to 10 carbon atoms; $R^3$, $R^4$ and Rs are each independently an alkyl or haloalkyl group having 1 to 20 carbon atoms, an aryl group having 6 to 20 carbon atoms or a silicon-containing group which forms a siloxane or silalkylene linkage to the silicon atom in the formula; $R^6$ is hydrogen, methyl, cyano or —C(=O)OR$^8$, wherein $R^8$ is hydrogen, a straight, branched or cyclic alkyl group of 1 to 10 carbon atoms or an acid labile group; $R^7$ is a straight, branched or cyclic alkyl group of 1 to 10 carbon atoms, —NR$^9$R$^{10}$ or —OR$^{11}$ wherein $R^9$, $R^{10}$ and $R^{11}$ are each independently hydrogen or a straight, branched or cyclic alkyl group of 1 to 10 carbon atoms; subscripts a and b are positive numbers satisfying 0<a+b≦1.

Preferably, in the recurring units "a" in formula (1), at least one of $R^3$, $R^4$ and $R^5$ is a silicon-containing group. More preferably, in the recurring units "a" in formula (1), at least one of $R^3$, $R^4$ and $R^5$ is a silicon-containing group which forms a silalkylene linkage to the silicon atom or a silicon-containing group which forms a siloxane linkage to the silicon atom.

In a preferred embodiment, the recurring unit "a" in formula (1) has a cyclic structure of the general formula (2):

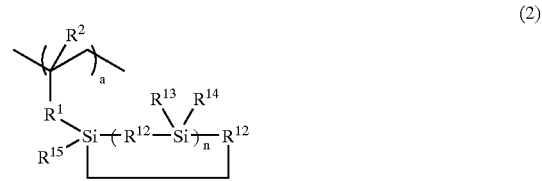

(2)

Herein $R^1$ and $R^2$ are as defined above, $R^{12}$ is an oxygen atom, a straight, branched or cyclic alkylene group of 1 to 10 carbon atoms, or an arylene group of 6 to 10 carbon atoms, $R^{13}$ to $R^{15}$ are each independently a straight, branched or cyclic alkyl or fluoroalkyl group of 1 to 10 carbon atoms or aryl group, and n is an integer of 2 to 10.

In a preferred embodiment, the polymer further comprises recurring units "c" containing acid labile groups in addition to the recurring units "a" and "b" of formula (1), the total of recurring units "a," "b" and "c" being 10 to 100 mol % of the polymer, the recurring units "c" being selected from the general formulae (C)-1 to (C)-5:

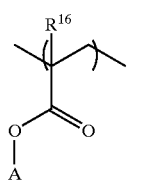
(C)-1

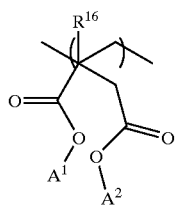
(C)-2

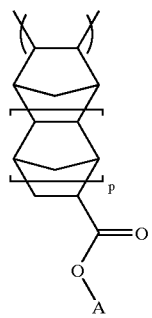
(C)-3

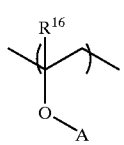
(C)-4

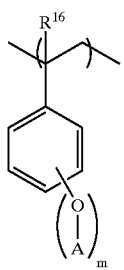
(C)-5

Herein $R^{16}$ is hydrogen, an alkyl group having 1 to 20 carbon atoms, aryl group having 3 to 20 carbon atoms, haloalkyl group having 1 to 20 carbon atoms or cyano group, A is an acid labile group, p is 0 or 1, m is 1 or 2, both or either one of $A^1$ and $A^2$ is an acid labile group, $A^1$ or $A^2$ is hydrogen, an alkyl group having 1 to 20 carbon atoms or adhesive group when it is not an acid labile group.

In a second aspect, the invention provides a resist composition comprising the polymer defined above, especially a chemically amplified, positive resist composition comprising (I) the polymer defined above, (II) a photoacid generator, (III) an organic solvent, and optionally (IV) a dissolution inhibitor. The resist composition may further comprise a basic compound.

In a third aspect, the invention provides a process for forming a resist pattern comprising the steps of applying the resist composition onto a substrate to form a coating; heat treating the coating and then exposing it to high-energy radiation having a wavelength of up to 300 nm or electron beam through a photo mask; and optionally heat treating the exposed coating and developing it with a developer. In one preferred embodiment wherein the substrate bears thereon an underlay on which the coating of the resist composition is formed, the process further involves the step of treating the underlay by an etching process including oxygen plasma etching, after the resist pattern formation. In another preferred embodiment wherein the substrate bears thereon an underlay on which the coating of the resist composition is formed, the process further involves the step of treating the underlay by etching with a halogen gas containing chlorine or bromine, after the resist pattern formation.

DESCRIPTION OF THE PREFERRED EMBODIMENTS

Polymer

Figure 1A:
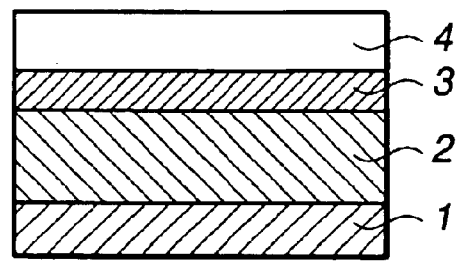
FIG. 1 schematically illustrates a layer structure patterning process involving oxygen etching.

The silicon-containing polymer or high-molecular-weight compound of the invention comprises recurring units of the general formula (1):

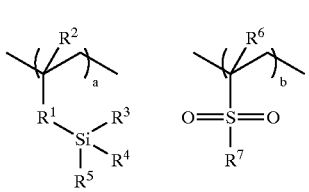
(1)

Herein $R^1$ is a single bond or a straight, branched or cyclic alkylene group of 1 to 10 carbon atoms, preferably 1 to 6 carbon atoms. $R^2$ is hydrogen or a straight, branched or cyclic alkyl group of 1 to 10 carbon atoms, preferably 1 to 6 carbon atoms. $R^3$, $R^4$ and $R^5$ are each independently an alkyl or haloalkyl group having 1 to 20 carbon atoms, preferably 1 to 10 carbon atoms, an aryl group having 6 to 20 carbon atoms, preferably 6 to 10 carbon atoms, or a silicon-containing group which forms a siloxane or silalkylene linkage to the silicon atom in the formula. $R^6$ is hydrogen, methyl, cyano or —C(=O)OR$^8$ wherein $R^8$ is hydrogen, a straight, branched or cyclic alkyl group of 1 to 10 carbon atoms, preferably 1 to 6 carbon atoms, or an acid labile group. $R^7$ is a straight, branched or cyclic alkyl group of 1 to 10 carbon atoms, preferably 1 to 6 carbon atoms, —NR$^9$R$^{10}$ or —OR$^{11}$ wherein $R^9$, $R^{10}$ and $R^{11}$ are each independently hydrogen or a straight, branched or cyclic alkyl group of 1 to 10 carbon atoms, preferably 1 to 6 carbon atoms. The subscripts a and b are positive numbers satisfying $0<a+b\leq 1$.

Examples of suitable alkyl groups include methyl, ethyl, propyl, isopropyl, butyl, isobutyl, tert-butyl, pentyl, cyclopentyl, hexyl, cyclohexyl, octyl, decyl, and dodecyl. Suitable haloalkyl groups are the foregoing alkyl groups in which some or all of the hydrogen atoms are replaced by halogen atoms such as fluorine and chlorine atoms. Of these, suitable fluoroalkyl groups include trifluoromethyl, 2,2,2- trifluoroethyl, 3,3,3-trifluoropropyl and 1,1,2,2,3,3,3-heptafluoropropyl. Examples of suitable aryl groups include phenyl, xylyl, tolyl and naphthyl. Suitable alkylene and arylene groups correspond to the foregoing alkyl and aryl groups, respectively, with one hydrogen atom attached to a carbon atom being eliminated.

The silicon-containing group which forms a siloxane or silalkylene linkage to the silicon atom in the formula is illustrated by the following formula:

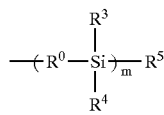

Herein $R^0$ is an oxygen atom or a straight, branched or cyclic alkylene group of 1 to 10 carbon atoms, preferably 1 to 6 carbon atoms, or an arylene group such as phenylene, or may be a combination of alkylene and arylene, m is an integer of 1 to 10, especially 1 to 6, $R^3$, $R^4$ and $R^5$ are as defined above.

In the recurring units "a" in formula (1), preferably at least one of $R^3$, $R^4$ and $R^5$ is a silicon-containing group, especially a silicon-containing group attached to the silicon atom in unit "a" through a siloxane or silalkylene linkage.

In a more preferred embodiment, the recurring unit "a" in formula (1) has a cyclic structure of the general formula (2):

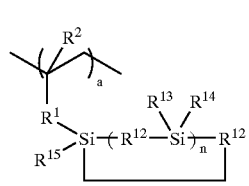

(2)

Herein $R^1$ and $R^2$ are as defined above, $R^{12}$ is an oxygen atom, a straight, branched or cyclic alkylene group of 1 to 10 carbon atoms, or an arylene group of 6 to 10 carbon atoms, $R^{13}$ to $R^{15}$ are each independently a straight, branched or cyclic alkyl or fluoroalkyl group of 1 to 10 carbon atoms, preferably 1 to 6 carbon atoms, or aryl group, and n is an integer of 2 to 10.

Examples of the alkyl, aryl, alkylene and arylene groups in formula (2) are as exemplified above.

Illustrative, non-limiting examples of silicon-containing recurring units "a" in formula (1) are given below:

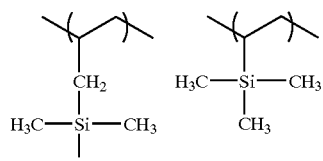

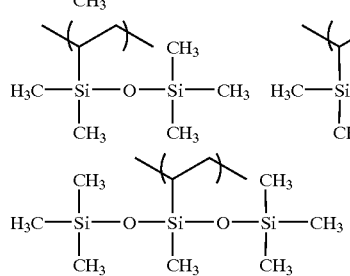

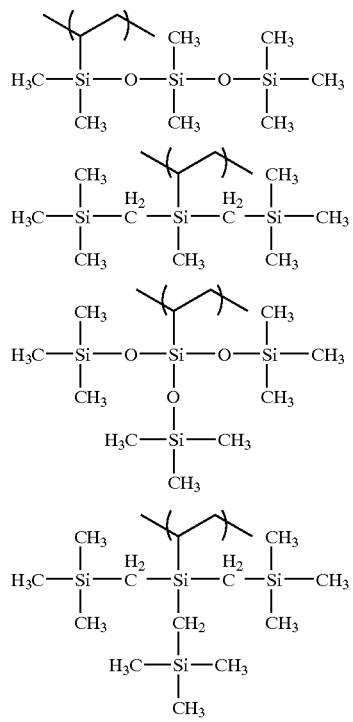

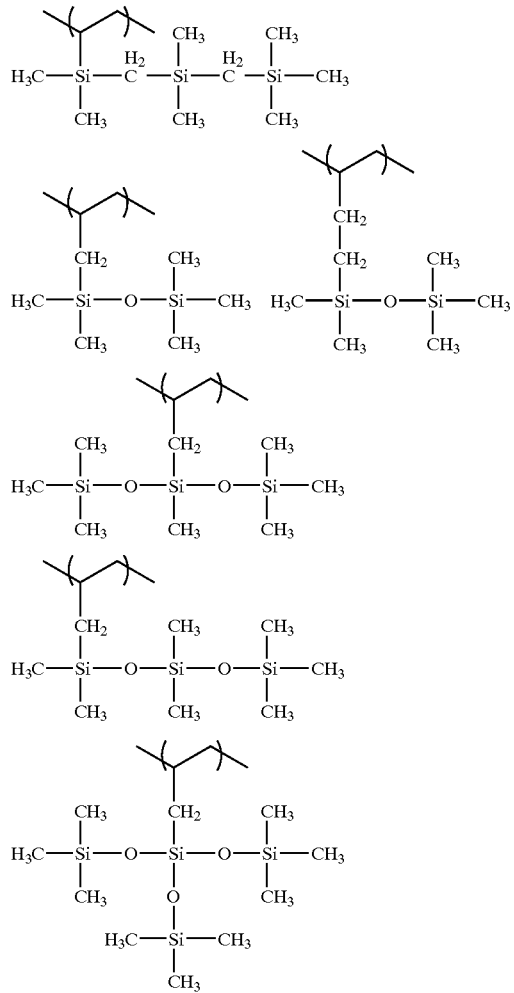

-continued
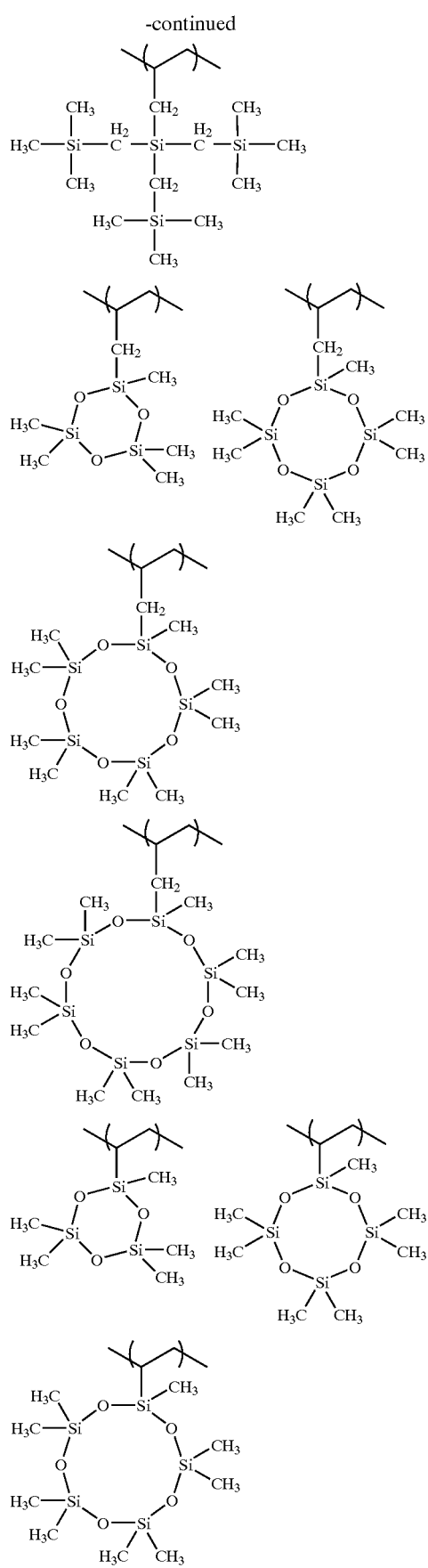
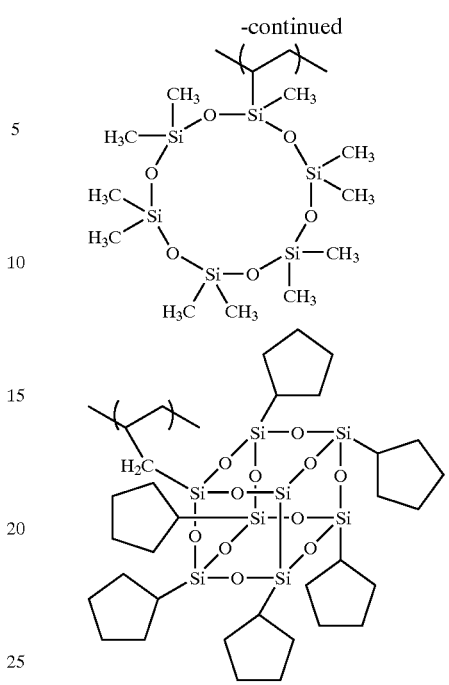
Illustrative, non-limiting examples of recurring units "b" in formula (1) are given below:
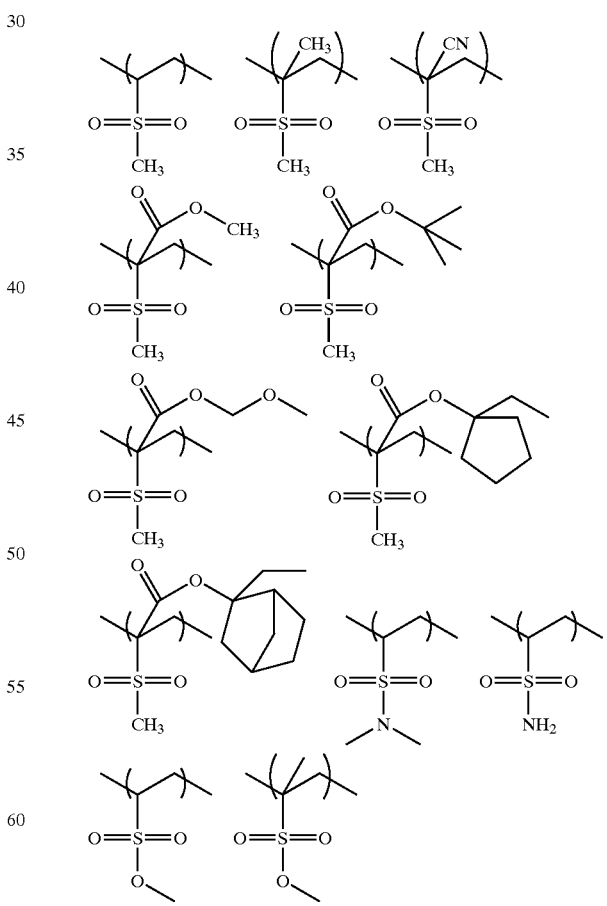
While the polymers of the invention essentially contain the recurring units "a" derived from vinylsilane or allylsilane derivatives and the recurring units "b" as shown by formula (1), the polymers in a preferred embodiment may additionally contain recurring units "c" containing acid labile groups in such amounts that the total of recurring units "a", "b" and "c" is 10 to 100 mol % of the polymer. The recurring units "c" are selected from the general formulae (C)-1 to (C)-5:

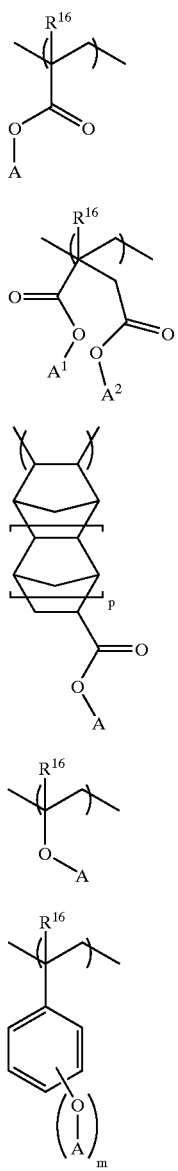

Herein $R^{16}$ is hydrogen, an alkyl group having 1 to 20 carbon atoms, preferably 1 to 10 carbon atoms, aryl group having 3 to 20 carbon atoms, preferably 6 to 10 carbon atoms, haloalkyl group having 1 to 20 carbon atoms, preferably 1 to 10 carbon atoms, or cyano group; A is an acid labile group; p is 0 or 1; m is 1 or 2; both or either one of $A^1$ and $A^2$ is an acid labile group, $A^1$ or $A^2$ is hydrogen, an alkyl group having 1 to 20 carbon atoms, preferably 1 to 10 carbon atoms or adhesive group when it is not an acid labile group.

Examples of the alkyl, aryl and haloalkyl groups are as exemplified above.

The acid labile groups represented by $R^8$ in recurring unit "b" in formula (1) and A (or $A^1$ and/or $A^2$) in formula (C) are selected from a variety of such groups, and preferably from among groups of the formulae (A-1) and (A-2) below, tertiary alkyl groups having 4 to 40 carbon atoms of the formula (A-3) below, trialkylsilyl groups in which each alkyl moiety has 1 to 6 carbon atoms, and oxoalkyl groups having 4 to 20 carbon atoms.

Of these acid labile groups, groups of formulae (A-1), (A-2) and (A-3) are especially preferred:

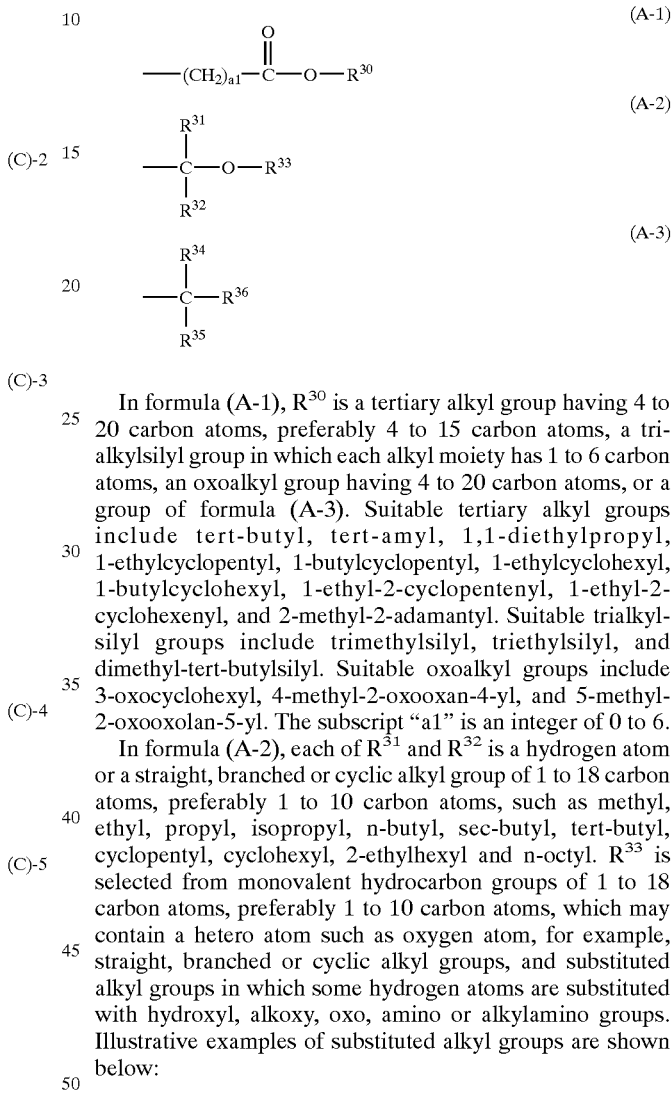

In formula (A-1), $R^{30}$ is a tertiary alkyl group having 4 to 20 carbon atoms, preferably 4 to 15 carbon atoms, a trialkylsilyl group in which each alkyl moiety has 1 to 6 carbon atoms, an oxoalkyl group having 4 to 20 carbon atoms, or a group of formula (A-3). Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable trialkylsilyl groups include trimethylsilyl, triethylsilyl, and dimethyl-tert-butylsilyl. Suitable oxoalkyl groups include 3-oxocyclohexyl, 4-methyl-2-oxooxan-4-yl, and 5-methyl-2-oxooxolan-5-yl. The subscript "a1" is an integer of 0 to 6.

In formula (A-2), each of $R^{31}$ and $R^{32}$ is a hydrogen atom or a straight, branched or cyclic alkyl group of 1 to 18 carbon atoms, preferably 1 to 10 carbon atoms, such as methyl, ethyl, propyl, isopropyl, n-butyl, sec-butyl, tert-butyl, cyclopentyl, cyclohexyl, 2-ethylhexyl and n-octyl. $R^{33}$ is selected from monovalent hydrocarbon groups of 1 to 18 carbon atoms, preferably 1 to 10 carbon atoms, which may contain a hetero atom such as oxygen atom, for example, straight, branched or cyclic alkyl groups, and substituted alkyl groups in which some hydrogen atoms are substituted with hydroxyl, alkoxy, oxo, amino or alkylamino groups. Illustrative examples of substituted alkyl groups are shown below:

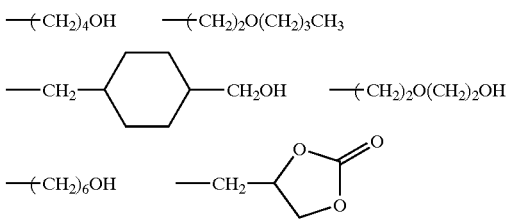

A pair of R and $R^{32}$, $R^{31}$ and $R^{33}$, or $R^{32}$ and $R^{33}$ may form a ring. Each of $R^{31}$, $R^{32}$ and $R^{33}$ is a straight or branched alkylene group of 1 to 18 carbon atoms, preferably 1 to 10 carbon atoms, when they form a ring.

Illustrative, non-limiting, examples of the acid labile group of formula (A-1) include tert-butoxycarbonyl, tert-butoxycarbonylmethyl, tert-amyloxycarbonyl, tertamyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups of formulae (A-1)-1 to (A-1)-9 below:

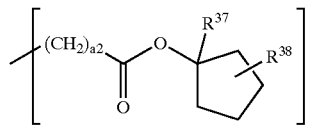
(A-1)-1

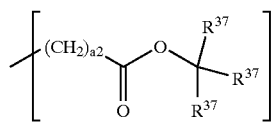
(A-1)-2

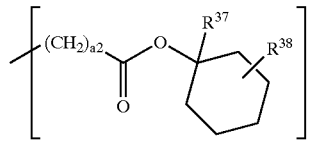
(A-1)-3

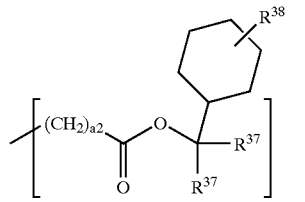
(A-1)-4

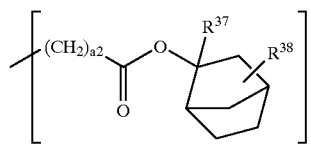
(A-1)-5

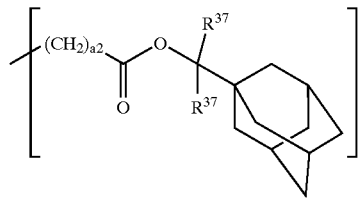
(A-1)-6

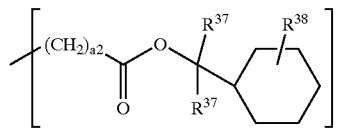
(A-1)-7

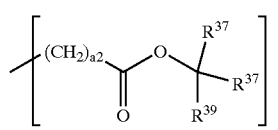
(A-1)-8

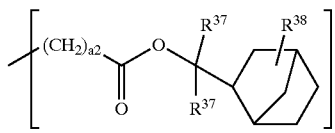
(A-1)-9

Note that a2 is an integer of 0 to 6.

In the above formulae, $R^{37}$ is each independently a straight, branched or cyclic alkyl group of 1 to 10 carbon atoms or an aryl group of 6 to 20 carbon atoms; $R^{38}$ is a hydrogen atom or a straight, branched or cyclic alkyl group of 1 to 10 carbon atoms; and $R^{39}$ is each independently a straight, branched or cyclic alkyl group of 2 to 10 carbon atoms or an aryl group of 6 to 20 carbon atoms.

Of the acid labile groups of formula (A-2), straight or branched groups are exemplified by those of formulae (A-2)-1 to (A-2)-23 below:

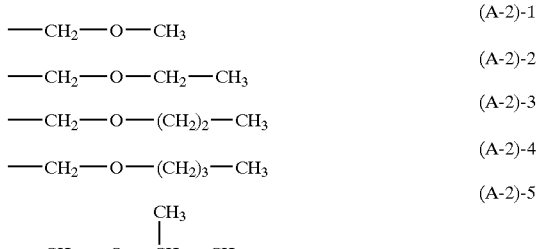

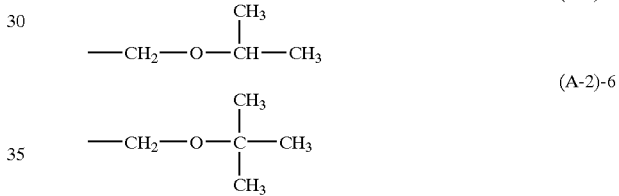

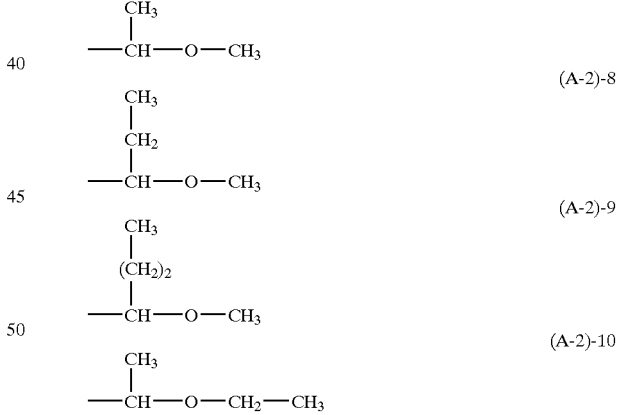

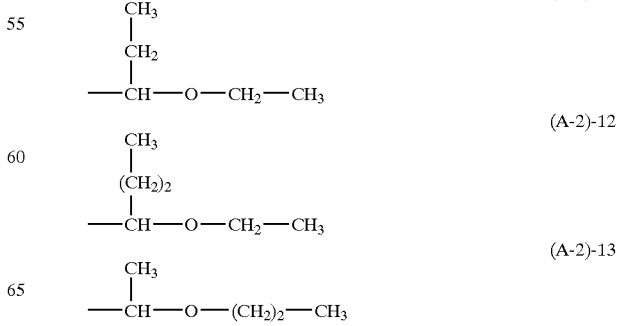

-continued

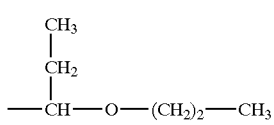 (A-2)-14

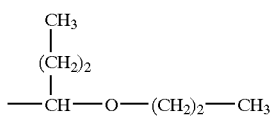 (A-2)-15

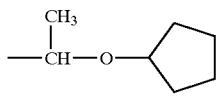 (A-2)-16

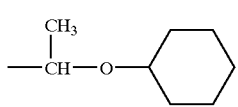 (A-2)-17

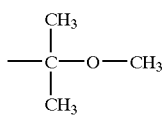 (A-2)-18

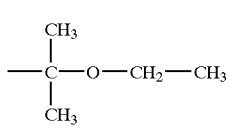 (A-2)-19

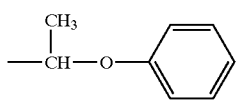 (A-2)-20

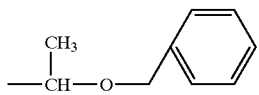 (A-2)-21

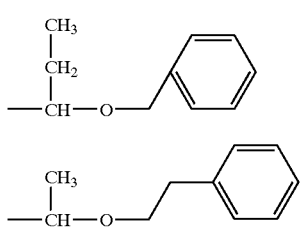 (A-2)-22

(A-2)-23

Of the acid labile groups of formula (A-2), examples of cyclic groups include tetrahydrofuran-2-yl, 2-methyltetrahydrofuran-2-yl, tetrahydropyran-2-yl and 2-methyltetrahydropyran-2-yl.

In an alternative embodiment, the polymer may be crosslinked within the molecule or between molecules with acid labile groups of the general formula (A-2a) or (A-2b):

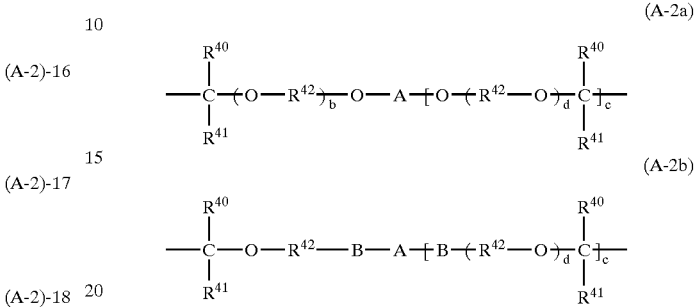

Herein $R^{40}$ and $R^{41}$ each are hydrogen or a straight, branched or cyclic alkyl group of 1 to 8 carbon atoms, or $R^{40}$ and $R^{41}$, taken together, may form a ring, and $R^{40}$ and $R^{41}$ are straight or branched alkylene groups of 1 to 8 carbon atoms when they form a ring; $R^{42}$ is a straight, branched or cyclic alkylene group of 1 to 10 carbon atoms; the subscripts b and d are 0 or integers of 1 to 10, and preferably 0 or integers of 1 to 5; c is an integer of 1 to 7; "A" is a (c+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—.

Preferably, "A" is selected from di- to tetra-valent straight, branched or cyclic alkylene groups of 1 to 20 carbon atoms, alkyltriyl groups, alkyltetrayl groups and arylene groups of 6 to 30 carbon atoms, which may be separated by a hetero atom and in which some of the hydrogen atoms attached to carbon atoms may be substituted with hydroxyl, carboxyl or acyl groups or halogen atoms. The subscript c is preferably an integer of 1 to 3.

The crosslinking acetal groups of formulae (A-2a) and (A-2b) are exemplified by the following formulae (A-2)-24 through (A-2)-31:

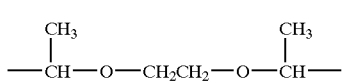

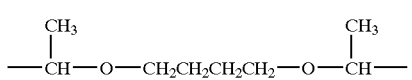

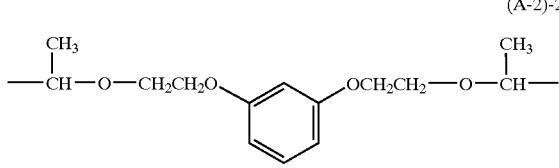

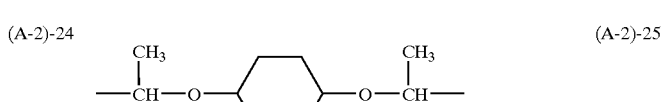 (A-2)-24

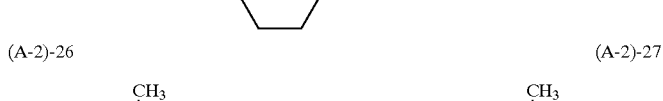 (A-2)-25

(A-2)-26

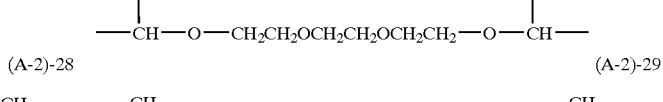 (A-2)-27

(A-2)-28

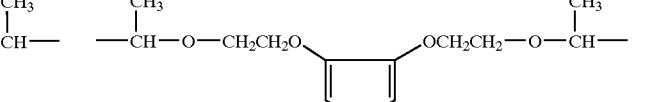 (A-2)-29

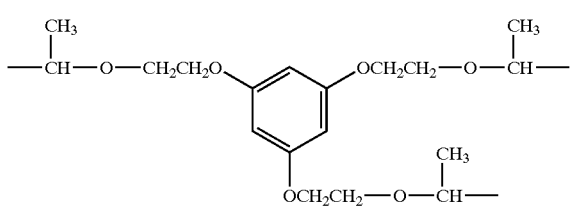

(A-2)-30

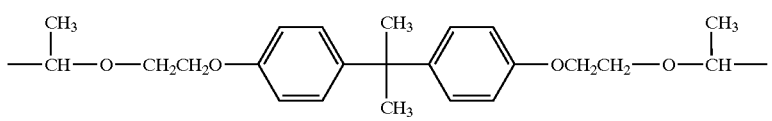

(A-2)-31

Referring to formula (A-3), each of $R^{34}$, $R^{35}$ and $R^{36}$ is a monovalent hydrocarbon group, typically a straight, branched or cyclic alkyl group of 1 to 20 carbon atoms, which may contain a hetero atom such as oxygen, sulfur, nitrogen or fluorine. A pair of $R^{34}$ and $R^{35}$, $R^{34}$ and $R^{36}$, or $R^{35}$ and $R^{36}$ may bond together to form a ring of 3 to 20 carbon atoms with the carbon atom to which they are attached.

Suitable tertiary alkyl groups of formula (A-3) include, but are not limited to, tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Also included in the tertiary alkyl groups are those of formulae (A-3)-1 to (A-3)-18 below:

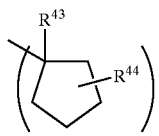

(A-3)-1

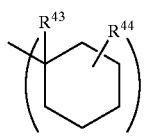

(A-3)-2

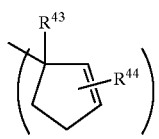

(A-3)-3

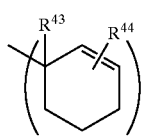

(A-3)-4

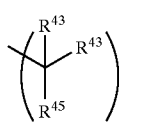

(A-3)-5

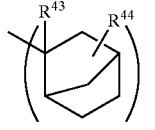

(A-3)-6

-continued

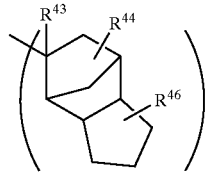

(A-3)-7

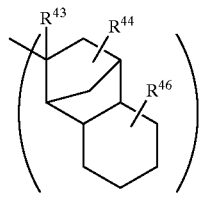

(A-3)-8

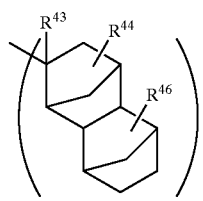

(A-3)-9

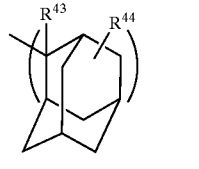

(A-3)-10

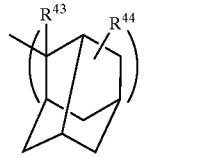

(A-3)-11

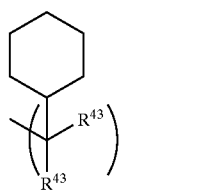

(A-3)-12

-continued

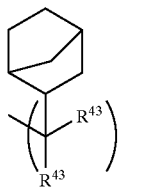
(A-3)-13

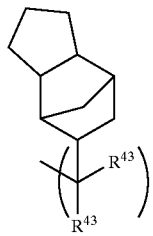
(A-3)-14

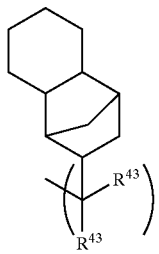
(A-3)-15

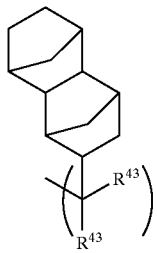
(A-3)-16

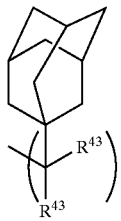
(A-3)-17

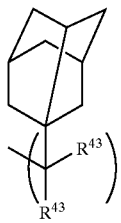
(A-3)-18

In the above formulae (A-3)-1 to (A-3)-18, $R^{43}$ is each independently a straight, branched or cyclic alkyl group of 1 to 8 carbon atoms or an aryl group of 6 to 20 carbon atoms, typically phenyl; each of $R^{44}$ and $R^{46}$ is hydrogen or a straight, branched or cyclic alkyl group of 1 to 20 carbon atoms; and $R^{45}$ is an aryl group of 6 to 20 carbon atoms, typically phenyl.

In a further embodiment, the polymer may be crosslinked within the molecule or between molecules with groups containing a di- or polyvalent alkylene or arylene group ($R^{47}$), as represented by the general formula (A-3)-19 or (A-3)-20:

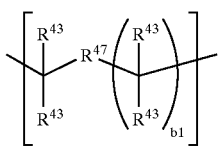
(A-3)-19

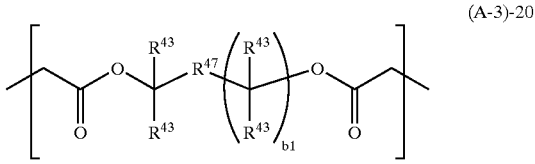
(A-3)-20

In formulae (A-3)-19 and (A-3)-20, $R^{43}$ is as defined above; $R^{47}$ is a straight, branched or cyclic alkylene group of 1 to 20 carbon atoms or an arylene group such as phenylene, which may contain a hetero atom such as oxygen, sulfur or nitrogen atom; b1 is an integer of 1 to 3.

Each of $R^{34}$, $R^{35}$ and $R^{36}$ in formula (A-3) may be a hydrocarbon group which contains a hetero atom such as oxygen, nitrogen or sulfur.

In formulae (A-1), (A-2) and (A-3), $R^{30}$, $R^{33}$ and $R^{36}$ are independently selected from substituted or unsubstituted aryl groups, typically phenyl, p-methylphenyl, p-ethylphenyl and alkoxy-substituted phenyl groups such as p-methoxyphenyl, aralkyl groups such as benzyl and phenethyl, the foregoing groups which contain an oxygen atom or the foregoing groups in which a hydrogen atom attached to a carbon atom is substituted with a hydroxyl group or two hydrogen atoms are substituted with an oxygen atom to form a carbonyl group, i.e., alkyl and oxoalkyl groups as shown below:

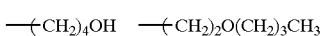

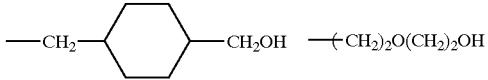

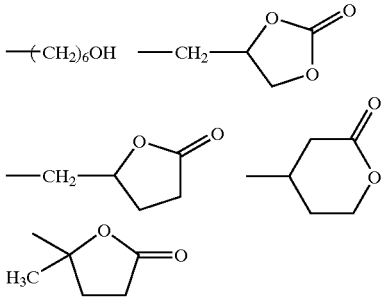

Examples of the trialkylsilyl group whose alkyl moiety each has 1 to 6 carbon atoms used as the acid labile group include trimethylsilyl, triethylsilyl and tert-butyldimethylsilyl.

Also useful are silicon-containing acid labile groups as shown below:

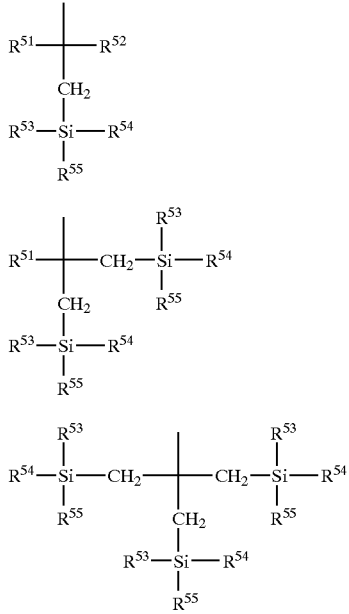

Herein $R^{51}$ and $R^{52}$ each are hydrogen or an alkyl group having 1 to 20 carbon atoms, $R^{53}$, $R^{54}$ and $R^{55}$ are each independently an alkyl or haloalkyl group having 1 to 20 carbon atom, an aryl group having 6 to 20 carbon atoms, or a silicon-containing group which is attached to the silicon atom through a siloxane or silmethylene linkage. $R^{51}$ and $R^{52}$, taken together, may form a ring.

Illustrative examples of the groups of formulae (A-4), (A-5) and (A-6) are given below:

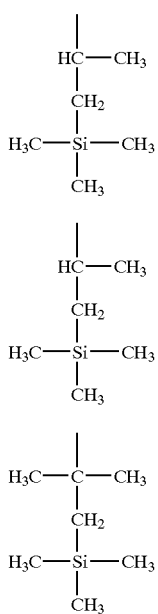

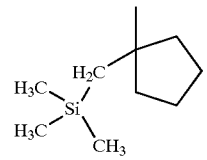

(A-4)-4

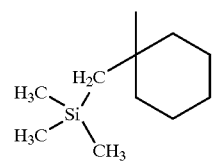

(A-4)-5

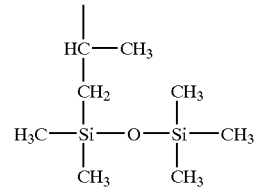

(A-4)-6

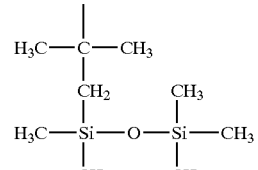

(A-4)-7

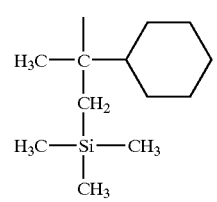

(A-4)-8

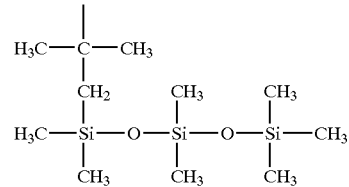

(A-4)-9

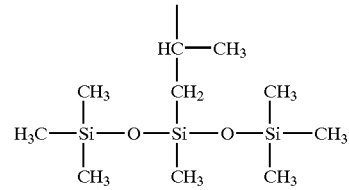

(A-4)-10

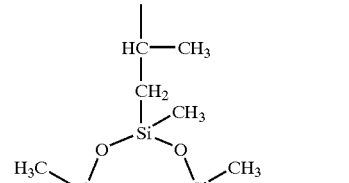

(A-4)-11

(A-4)-12

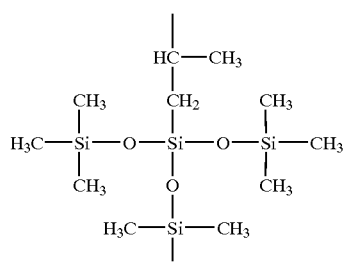

(A-5)-1

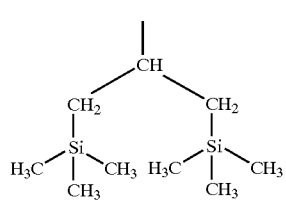

(A-6)-1

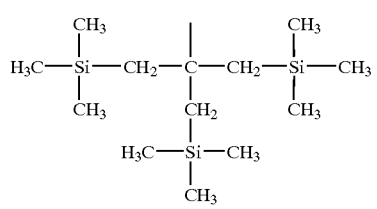

Cyclic silicon-containing acid labile groups of the general formulae (A-7) and (A-8) are employable as well:

(A-7)

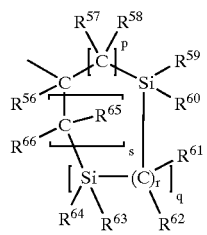

(A-8)

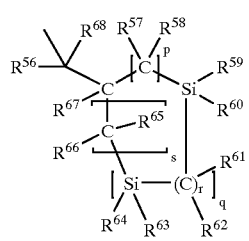

Herein $R^{56}$ and $R^{68}$ each are a straight, branched or cyclic alkyl group having 1 to 20 carbon atoms, $R^{57}$, $R^{58}$, $R^{61}$, $R^2$, $R^{65}$ and $R^{66}$ each are hydrogen or a straight, branched or cyclic alkyl group having 1 to 20 carbon atoms, $R^{59}$, $R^{60}$, $R^{63}$ and $R^{64}$ each are hydrogen, a straight, branched or cyclic alkyl or fluoroalkyl group having 1 to 20 carbon atoms, or aryl group having 6 to 20 carbon atoms, p, q, r and s each are an integer of 0 to 10, satisfying $1 \leq p+q+s \leq 20$.

Illustrative examples of the groups of formulae (A-7) and (A-8) are shown below as formulae (A-7)-1 through (A-8)-6:

(A-7)-1

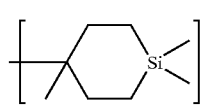

(A-7)-2

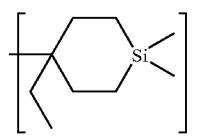

(A-7)-3

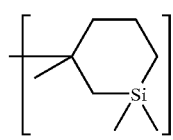

(A-7)-4

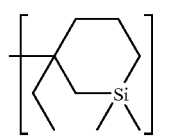

(A-7)-5

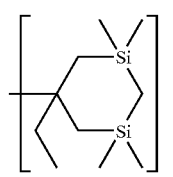

(A-7)-6

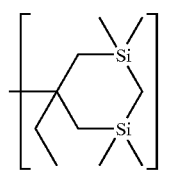

(A-8)-1

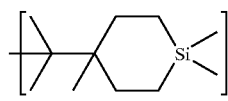

(A-8)-2

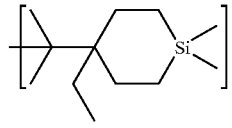

(A-8)-3

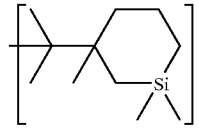

(A-8)-4

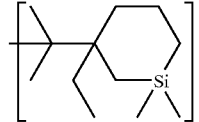

(A-8)-5
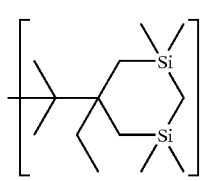
(A-8)-6
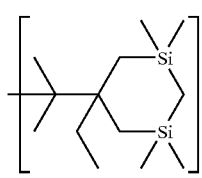
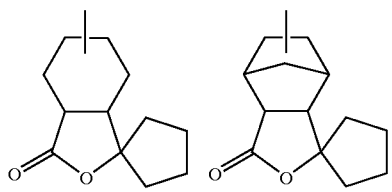
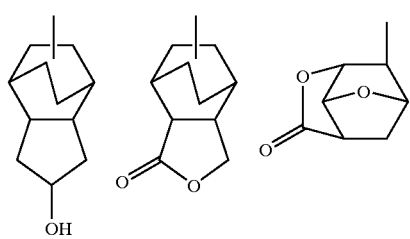
The adhesive group represented by $A^1$ or $A^2$ in formula (C)-2 is exemplified below:
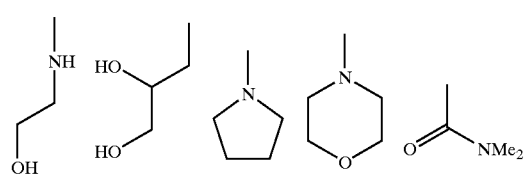
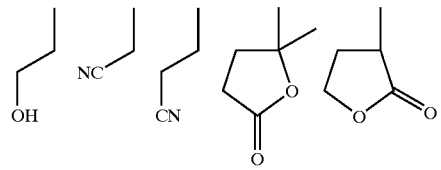
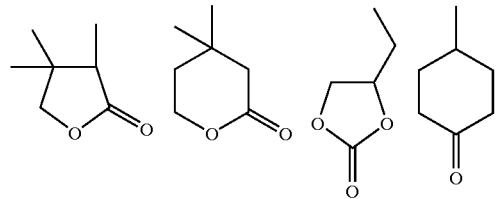
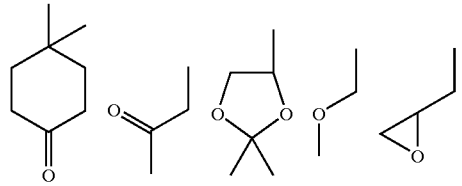
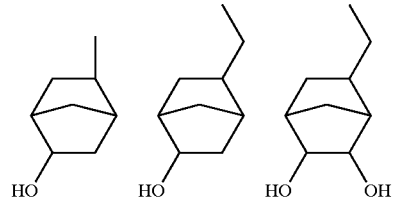
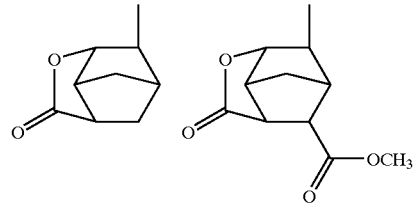
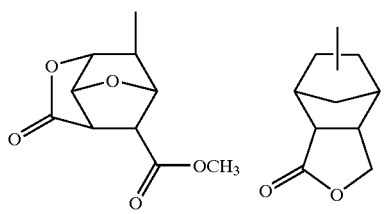
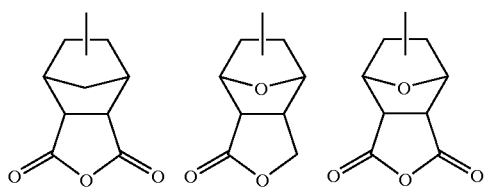
The silicon-containing polymer of the invention may further contain recurring units "d" of one or more species of the formulae shown below:
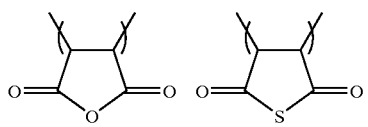
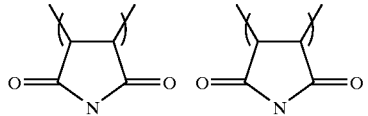
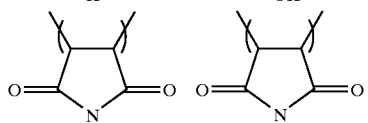
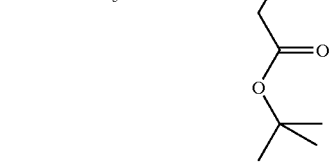

-continued

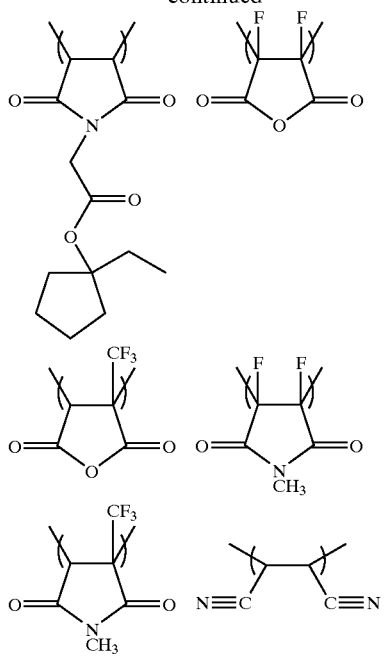

In addition to the units described above, the polymer of the invention may have further copolymerized therewith a monomer which serves to increase the silicon content for enhancing dry etching resistance. Such recurring units "e" derived from silicon-containing monomers are exemplified below:

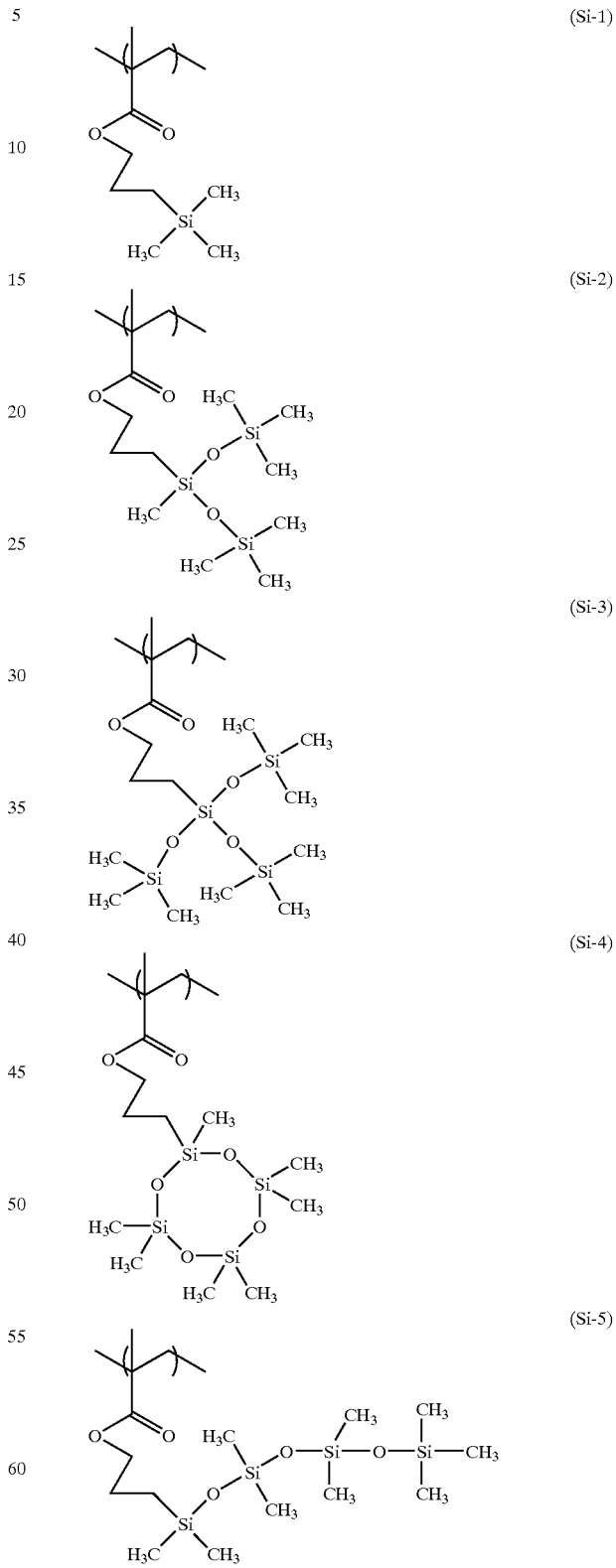

In the silicon-containing polymer of the invention, a monomer having a substituent group for improving adhesion may be additionally incorporated. The monomers effective for improving adhesion are those monomers having a hydrophilic substituent group such as anhydride, ester (lactone), carbonate, alcohol, amide or ketone. Examples of recurring units "f" derived from such monomers are shown below:
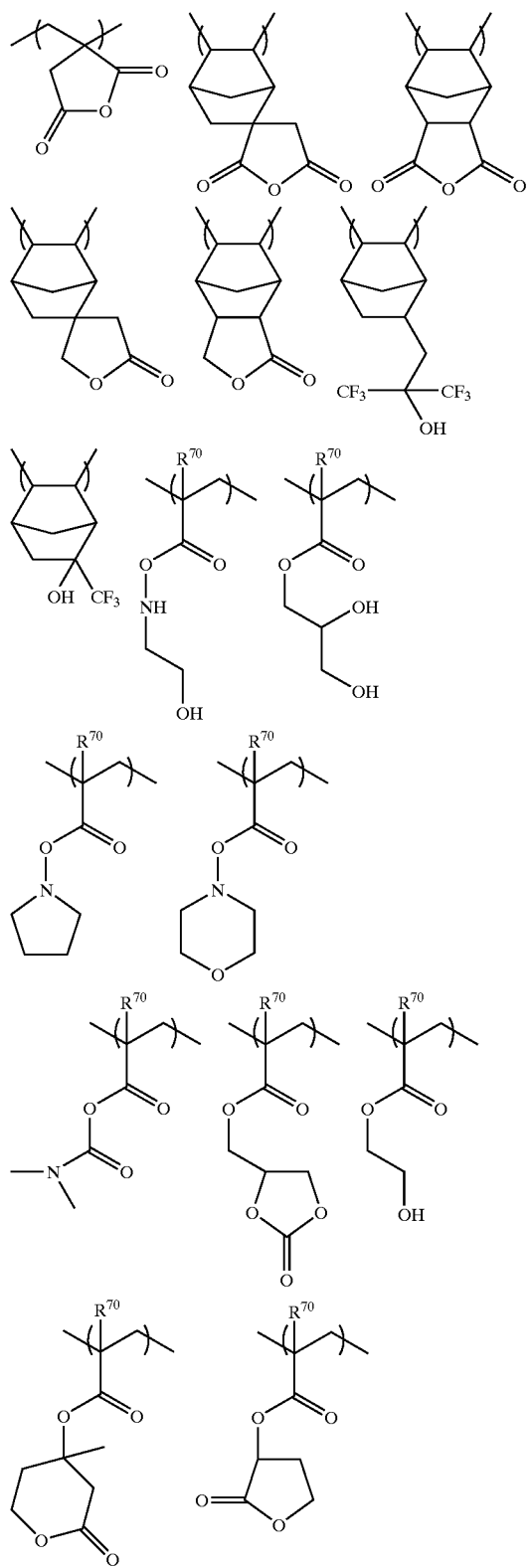
-continued
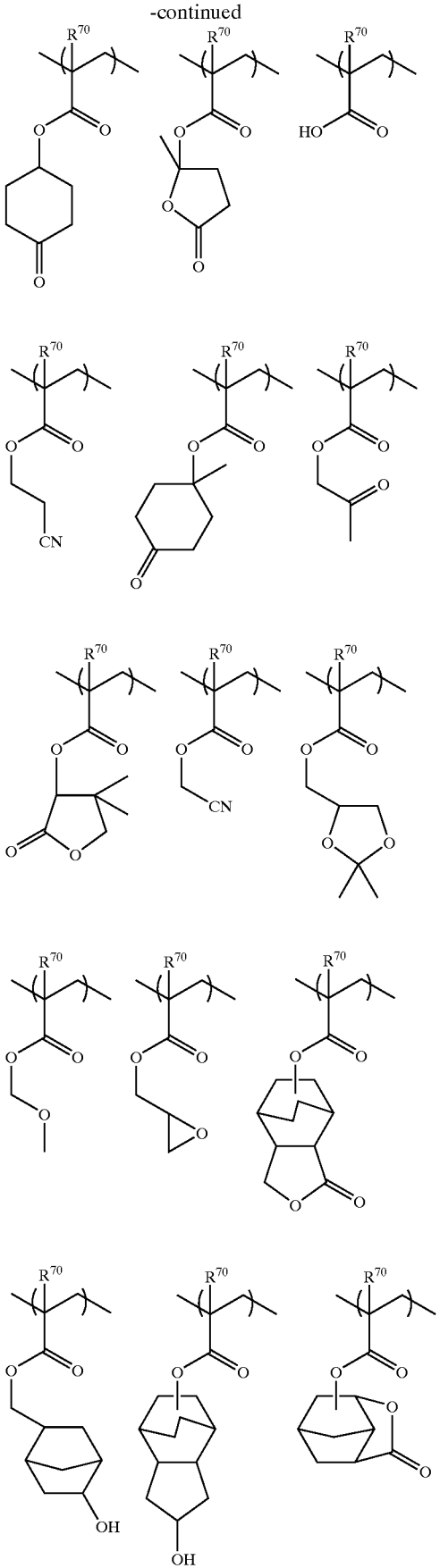

-continued

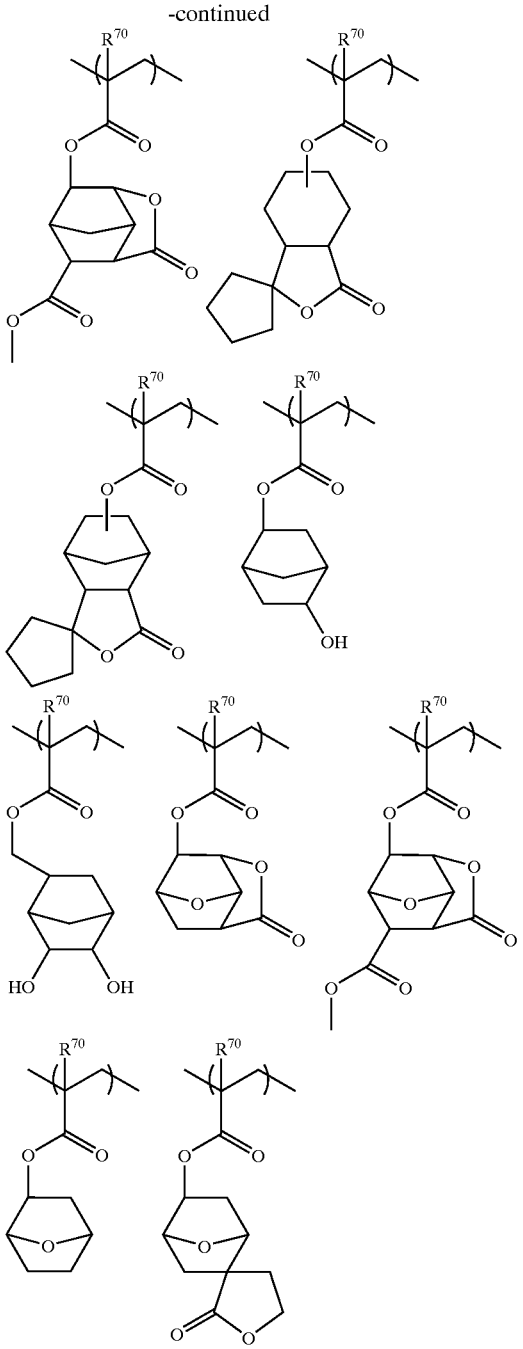

$R^{70}$ is hydrogen or methyl.

In the polymer of the invention, when characteristics of a resist composition comprising the same are taken into account, a and b in formula (1) are positive numbers, preferably $0.02 \leq a < 1$, especially $0.05 \leq a < 1$, $0.1 \leq b < 1$, especially $0.2 \leq b < 1$, and $0.05 \leq a+b \leq 1$, especially $0.1 \leq a+b \leq 1$.

In the polymer of the invention, the recurring units "c" are optionally included so as to satisfy $0 \leq c < 1$, preferably $0 \leq c < 0.8$, more preferably $0 \leq c < 0.6$. In the event that the recurring units "b" do not possess acid labile groups, it is preferred that the recurring units "c" be included so as to satisfy $0.1 \leq c$, especially $0.2 \leq c$. For the recurring units "d", "e" and "f" described above, it is preferred that d, e and f be $0 \leq d < 0.6$, especially $0 \leq d < 0.5$; $0 \leq e < 0.5$, especially $0 \leq e < 0.3$; $0 \leq f < 0.5$, especially $0 \leq f < 0.3$. Note that $a+b+c+d+e+f=1$.

Smaller amounts of units "a" lead to a lower silicon content, resulting in a lowering of resistance to oxygen gas etching. Smaller amounts of units "b" lead to a lower proportion of adhesive groups and hence, a lowering of adhesion, which allows for pattern stripping and scum formation after development. Smaller amounts of units "c" lead to a lower proportion of acid labile groups, resulting in a lowering of dissolution contrast and a failure of pattern resolution. Where units "b" contain acid labile groups, units "c" are not necessarily needed. If the proportion of any unit is too large, the proportion of the remaining units becomes lower, failing to achieve a good balance of etching resistance, adhesion and dissolution contrast. Pattern dimensions, pattern shape and etching resistance may be controlled as desired by selecting appropriate values of a, b and c within the above ranges.

The polymers may have a weight average molecular weight (Mw) of about 1,000 to 500,000, and preferably about 2,000 to 30,000. With too low Mw, polymers become less resistant to heat. Polymers with too high Mw have low alkali solubility and tend to induce a footing phenomenon after pattern formation.

It is recommended that multi-component copolymers containing units of formula (1) have a controlled molecular weight dispersity (Mw/Mn). If a copolymer has a wide dispersity, it contains more polymer fractions of low molecular weight and high molecular weight and thus forms a pattern after exposure with foreign matter left thereon or its shape disrupted. The influence of a molecular weight and its dispersity becomes greater as the pattern rule becomes finer. In order that a resist composition be advantageously used in patterning features to a finer size, the multi-component copolymer should preferably be a narrow disperse one having a molecular weight dispersity of 1.0 to 2.0, especially 1.0 to 1.5.

In one typical embodiment, the polymer can be conventionally synthesized by dissolving one or more vinyl monomers having a silicon-containing group capable of providing units "a" and optionally units "e" and one or more comonomers capable of providing units "b" and optionally units "c", "d" and "f" in an organic solvent, adding a catalyst thereto, and effecting polymerization while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for preparation of the polymers of the invention are radical polymerization of triggering polymerization with radicals such as azobisisobutyronitrile (AIBN) or the like, and ion (anion) polymerization using catalysts such as alkyl lithium. These polymerization steps may be carried out in their conventional manner.

Resist Composition

The polymer of the invention can be used as a base resin in resist compositions. Therefore, a resist composition comprising the polymer is contemplated herein. The resist composition is preferably a chemical amplification type resist composition, and especially chemical amplification type positive working resist composition.

In one embodiment, the chemically amplified positive resist composition is defined as comprising (I) the above-defined polymer as a base resin, (II) a photoacid generator, and (III) an organic solvent, or as comprising (I) the above-defined polymer as a base resin, (II) a photoacid generator, (III) an organic solvent, and (IV) a dissolution inhibitor. In either case, the composition preferably further comprises (V) a basic compound.

Component (I) is the polymer defined above. The polymer component used herein may be a blend of polymers having different molecular weights or dispersities, a blend of polymers having different acid labile groups, silicon-containing groups or adhesive groups, or a blend of polymers in different proportions.

Component (II)

Suitable examples of the photoacid generator (II) include onium salts of general formula (3) below, diazomethane derivatives of formula (4), glyoxime derivatives of formula (5), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (3):

(3)

In formula (3), $R^{71}$, which may be the same or different, is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and c is 2 or 3.

Illustrative examples of alkyl groups represented by $R^{71}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 2,3,4,5,6-pentafluorobenzenesulfonate; and alkylsulfonate ions such as mesylate and butanesulfonate.

The diazomethane derivatives used as the photoacid generator are of the general formula (4):

(4)

In the formula, $R^{72}$ and $R^{73}$, which may be the same or different, are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{72}$ and $R^{73}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 2,3,4,5,6-pentafluorophenyl. Exemplary aralkyl groups include benzyl and phenethyl.

The glyoxime derivatives used as the photoacid generator are of the general formula (5):

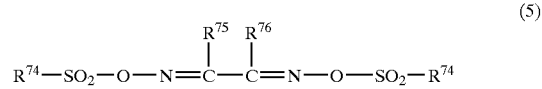
(5)

In the formula, $R^{14}$, $R^{75}$, and $R^{76}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{75}$ and $R^{76}$ may bond together to form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{74}$ to $R^{76}$ are exemplified by the same groups as mentioned above for $R^{72}$ and $R^{13}$. Examples of alkylene groups represented by $R^{75}$ and $R^{76}$ include methylene, ethylene, propylene, butylene, and hexylene.

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n- butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; and naphthoquinone diazide sulfonate derivatives. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 50 parts, especially 0.5 to 40 parts by weight per 100 parts by weight of the entire base resin. At less than 0.2 part, the amount of acid generated during exposure may be too small and the sensitivity and resolution be poor, whereas the addition of more than 50 parts may lower the transmittance of the resist and result in a poor resolution.

Component (III)

The organic solvent (III) used in the resist composition of the invention may be any organic solvent in which the base resin, photoacid generator, and other components are soluble. Illustrative, non-limiting examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

Component (IV)

The dissolution inhibitor (IV) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor. The acid labile groups may be those of the above formulae (A-1) to (A-8).

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol.

Illustrative, non-limiting examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'- tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (IV) is up to about 20 parts, and especially up to about 15 parts by weight per 100 parts by weight of the entire base resin in the composition. With more than 20 parts of the dissolution inhibitor, the resist composition becomes less heat resistant because of an increased content of monomer components.

Component (V)

The basic compound (V) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, the aliphatic amines are preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture:

  (B)-1

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

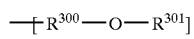 (X)-1

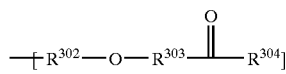 (X)-2

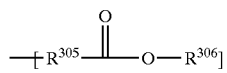 (X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-methyl-bis[2-(methoxycarbonyloxy)ethyl]amine, N-methyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B)-2:

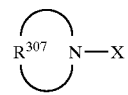 (B)-2

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-

(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl) methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B)-3 to (B)-6 may be blended:

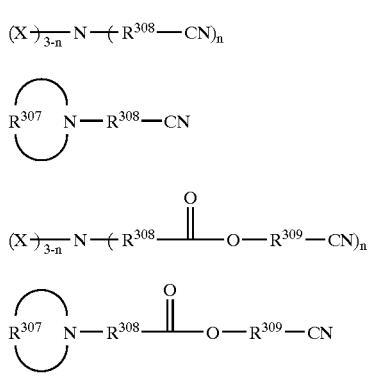

(B)-3

(B)-4

(B)-5

(B)-6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds include 3-(diethylamino)propionitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N-N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl) aminoacetonitrile, N,N-bis(2-acetoxyethyl) aminoacetonitrile, N,N-bis(2-formyloxyethyl) aminoacetonitrile, N,N-bis(2-methoxyethyl) aminoacetonitrile, N,N-bis[2-(methoxymethoxy)ethyl] aminoacetonitrile, methyl N-cyanomethyl-N-(2-methoxyethyl)-3-aminopripionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-(2-(methoxymethoxy)ethyl) aminoacetonitrile, N-cyanomethyl-N-(3-hydroxy-1-propyl) aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis (cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis (2-methoxyethyl)-3-aminopropionate, cyanomethyl N,N-bis [2-(methoxymethoxy)ethyl]-3-aminoptopionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compounds may be used alone or in admixture of two or more. The basic compound is preferably formulated in an amount of 0.001 to 2 parts, and especially 0.01 to 1 part by weight, per 100 parts by weight of the entire base resin in the resist composition. Less than 0.001 part of the basic compound may fail to provide the desired effect whereas more than 2 parts of the basic compound may result in too low a sensitivity.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 µm, which is then pre-baked on a hot plate at 60 to 200° C. for 10 seconds to 10 minutes, and preferably at 80 to 150° C. for 30 seconds to 5 minutes. A patterning mask having the desired pattern may then be placed over the resist film, and the film exposed through the mask to an electron beam or to high-energy radiation having a wavelength of less than 300 nm, such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for 30 seconds to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF (193 nm), $Kr_2$ (146 nm) or $KrAr_2$ (134 nm) excimer laser or a laser, especially $F_2$ (157 nm) or $Ar_2$ (126 nm) laser, x-rays, or an electron beam. The desired pattern may not be obtainable outside the upper and lower limits of the above range.

Figure 1B:
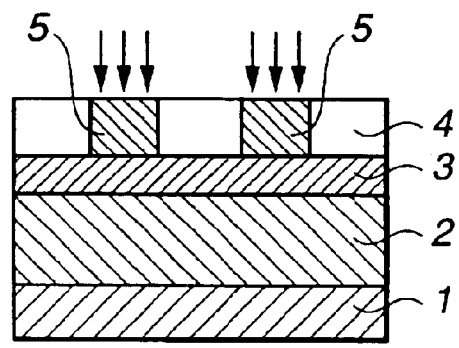
Figure 1C:
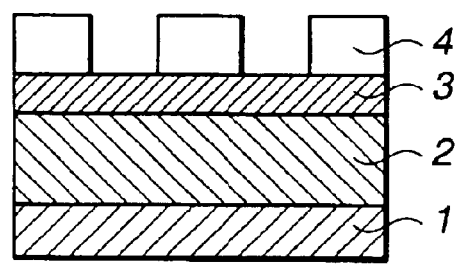
Figure 1D:
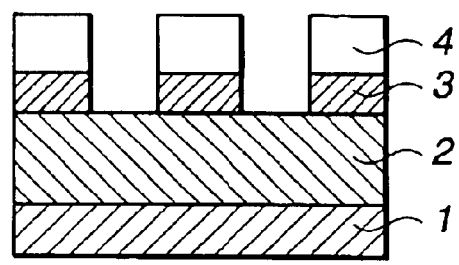
Figure 1E:
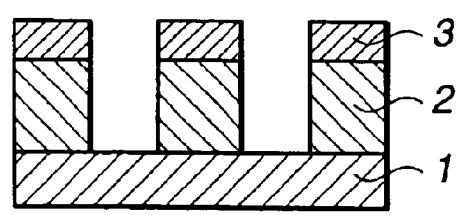

Referring to FIG. 1, there is illustrated in cross section a process involving forming a silicon-containing resist pattern through exposure, PEB and development steps, patterning an underlying organic film by oxygen gas etching, and processing a further underlying film by dry etching. In FIG. 1A, a layer structure includes a support substrate 1, a processable substrate 2 of $SiO_2$, SiN or the like, an organic film 3 of a novolac resin, polyhydroxystyrene or the like, and a resist layer 4 formed of the resist composition of the invention. In FIG. 1B, selected areas 5 of the resist layer 4 are exposed to light. PEB and development are then carried out to remove the exposed areas as shown in FIG. 1C. In FIG. 1D, the exposed areas of the organic film 3 are etched away with oxygen plasma. In FIG. 1E, the exposed areas of the processable substrate 2 are etched away with CF gas, completing the pattern.

The oxygen gas etching is a reactive plasma etching using oxygen gas as a main component and can process the underlying organic film at a high aspect ratio. $SO_2$ or $N_2$ gas may be added to oxygen gas for protecting side walls for preventing the film from being configured to a T-top profile by overetching. Prior to the oxygen gas etching, brief etching with a fluorocarbon gas may be carried out for removing any scum of the resist after development and smoothening line edges to prohibit roughening. The subsequent dry etching of the processable film may be etching using a fluorocarbon gas as a main component when the processable film is $SiO_2$ or $Si_3N_4$. Exemplary fluorocarbon gases are $CF_4$, $CHF_3$, $CH_2F_2$, $C_2F_6$, $C_3F_8$, $C_4F_{10}$ and $C_5F_{12}$. At the same time as the dry etching of the processable film, the silicon-containing resist film can be stripped off. Etching with chlorine or bromine gas as a main component is employed when the processable film is polysilicon, tungsten silicide or TiN/Al.

Since the resist composition of the invention has excellent resistance to etching with chlorine or bromine gas as a main component, the processing technique may be the same as used for the single layer resist.

Figure 2A:
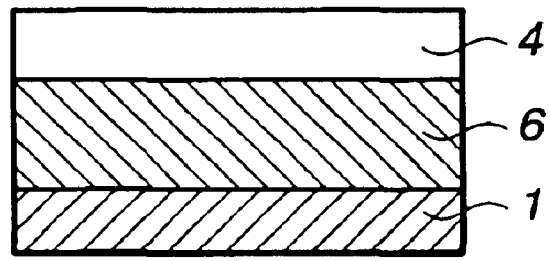
FIG. 2 schematically illustrates a layer structure patterning process involving chlorine etching.
Figure 2B:
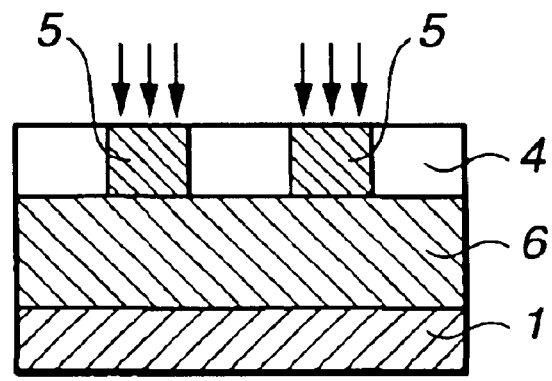
Figure 2C:
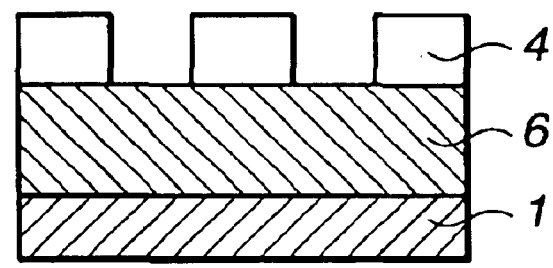
Figure 2D:
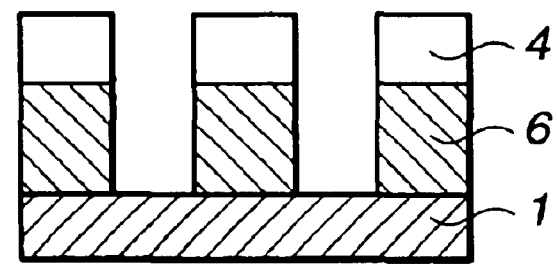

This embodiment is illustrated in FIG. 2. The layer structure shown in FIG. 2A includes a support substrate 1, a processable substrate 6, and a resist layer 4 according to the invention. Exposure of selected areas 5 of the resist layer 4 is followed by PEB and development as shown in FIGS. 2B and 2C. Thereafter, the processable substrate 6 is etched with a Cl gas as shown in FIG. 2D. In this embodiment, the silicon-containing resist film according to the invention is formed in a desired pattern directly on the processable film, which can be processed by etching with chlorine or bromine gas as a main component.

The resist composition comprising a silicon-containing polymer as a base resin according to the invention is sensitive to high-energy radiation, and has excellent sensitivity and resolution at a wavelength of less than 300 nm as well as satisfactory oxygen plasma etching resistance. These features of the inventive resist composition enable its use particularly in the bi-layer resist technology, and permit a finely defined pattern having sidewalls perpendicular to the substrate to be easily be formed, making the resist ideal as a micropatterning material in VLSI fabrication.

EXAMPLE

Synthesis Examples and Examples are given below together with Comparative Examples for further illustrating the invention although the invention is not limited thereby. The abbreviations used herein are GPC for gel permeation chromatography, NMR for nuclear magnetic resonance, Mw for weight average molecular weight, Mn for number average molecular weight, and THF for tetrahydrofuran.

(1) Synthesis of Silicon-Containing Polymers

It is noted that Monomers a1 to a7, b1 to b5 and c1 to c5 are shown at the end of Synthesis Examples.

Synthesis Example 1

In a 100-ml flask were admitted 9.8 g of maleic anhydride, 10.6 g of monomer b1, 10.7 g of monomer a1, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis (2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 31 g of a white polymer.

The polymer was analyzed by $^{13}$C- and $^1$H-NMR and GPC, with the results shown below.

Copolymer Compositional Ratio maleic anhydride:monomer b1:monomer a1:monomer c1=20.3:12.2:26.5:41.0

Mw=8,800

Molecular weight dispersity (Mw/Mn)=1.69

This is designated Polymer 1.

Synthesis Example 2

In a 100-ml flask were admitted 13.2 g of monomer b2, 10.7 g of monomer a1, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 25.5 g of a white polymer.

The polymer was analyzed by $^{13}$C- and $^1$H-NMR and GPC, with the results shown below.

Copolymer Compositional Ratio monomer b2:monomer a1:monomer c1=35.8:25.5:38.7

Mw=9,900

Dispersity (Mw/Mn)=1.72

This is designated Polymer 2.

Synthesis Example 3

In a 100-ml flask were admitted 14.2 g of monomer b3, 10.7 g of monomer a1, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 22.2 g of a white polymer.

The polymer was analyzed by $^{13}$C- and $^1$H-NMR and GPC, with the results shown below.

Copolymer Compositional Ratio monomer b3:monomer a1:monomer c1=42.8:22.5:34.7

Mw=10,200

Dispersity (Mw/Mn)=1.83

This is designated Polymer 3.

Synthesis Example 4

In a 100-ml flask were admitted 13.2 g of monomer b4, 10.7 g of monomer a1, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 27.2 g of a white polymer.

The polymer was analyzed by $^{13}$C- and $^1$H-NMR and GPC, with the results shown below.

Copolymer Compositional Ratio monomer b4:monomer a1:monomer c1=32.8:32.5:34.7

Mw=11,200

Dispersity (Mw/Mn)=1.93

This is designated Polymer 4.

Synthesis Example 5

In a 100-ml flask were admitted 13.8 g of monomer b5, 10.7 g of monomer a1, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 27.7 g of a white polymer.

The polymer was analyzed by $^{13}$C- and $^1$H-NMR and GPC, with the results shown below.

Copolymer Compositional Ratio monomer b5:monomer a1:monomer c1=33.1:25.2:41.7

Mw=16,100

Dispersity (Mw/Mn)=1.97

This is designated Polymer 5.

Synthesis Example 6

In a 100-ml flask were admitted 13.8 g of monomer b5, 11.4 g of monomer a2, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 29.1 g of a white polymer.

The polymer was analyzed by $^{13}$C- and $^1$H-NMR and GPC, with the results shown below.

Copolymer Compositional Ratio monomer b5:monomer a2:monomer c1=33.9:23.3:42.8

Mw=15,600

Dispersity (Mw/Mn)=1.56

This is designated Polymer 6.

Synthesis Example 7

In a 100-ml flask were admitted 13.8 g of monomer b5, 8.9 g of monomer a3, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 26.6 g of a white polymer.

The polymer was analyzed by $^{13}$C- and $^1$H-NMR and GPC, with the results shown below.

Copolymer Compositional Ratio monomer b5:monomer a3:monomer c1=44.9:18.4:36.7

Mw=10,600

Dispersity (Mw/Mn)=1.77

This is designated Polymer 7.

Synthesis Example 8

In a 100-ml flask were admitted 13.8 g of monomer b5, 8.2 g of monomer a4, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 25.6 g of a white polymer.

The polymer was analyzed by $^{13}$C- and $^{1}$H-NMR and GPC, with the results shown below.

Copolymer Compositional Ratio monomer b5:monomer a4:monomer c1=44.5:17.8:37.7

Mw=10,900

Dispersity (Mw/Mn)=1.88

This is designated Polymer 8.

Synthesis Example 9

In a 100-ml flask were admitted 13.8 g of monomer b5, 10.2 g of monomer a5, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 25.1 g of a white polymer.

The polymer was analyzed by $^{13}$C- and $^{1}$H-NMR and GPC, with the results shown below.

Copolymer Compositional Ratio monomer b5:monomer a5:monomer c1=44.1:12.7:43.2

Mw=9,030

Dispersity (Mw/Mn)=1.61

This is designated Polymer 9.

Synthesis Example 10

In a 100-ml flask were admitted 13.8 g of monomer b5, 10.3 g of monomer a6, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 23.6 g of a white polymer.

The polymer was analyzed by $^{13}$C- and $^{1}$H-NMR and GPC, with the results shown below.

Copolymer Compositional Ratio monomer b5:monomer a6:monomer c1=45.2:8.8:46.0

Mw=9,800

Dispersity (Mw/Mn)=1.64

This is designated Polymer 10.

Synthesis Example 11

In a 100-ml flask were admitted 13.8 g of monomer b5, 10.3 g of monomer a7, 18.2 g of monomer c1, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 26.2 g of a white polymer.

The polymer was analyzed by $^{13}$C- and $^{1}$H-NMR and GPC, with the results shown below.

Copolymer Compositional Ratio monomer b5:monomer a7:monomer c1=45.2:8.8:46.0

Mw=9,800

Dispersity (Mw/Mn)=1.64

This is designated Polymer 11.

Synthesis Example 12

In a 100-ml flask were admitted 13.8 g of monomer b5, 10.3 g of monomer a6, 20.8 g of monomer c2, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 26.9 g of a white polymer.

The polymer was analyzed by $^{13}$C- and $^{1}$H-NMR and GPC, with the results shown below.

Copolymer Compositional Ratio monomer b5:monomer a6:monomer c2=52.2:8.8:39.0

Mw=10,300

Dispersity (Mw/Mn)=1.84

This is designated Polymer 12.

Synthesis Example 13

In a 100-ml flask were admitted 13.8 g of monomer b5, 10.3 g of monomer a6, 20.1 g of monomer c3, and 30 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 29.3 g of a white polymer.

The polymer was analyzed by $^{13}$C- and $^1$H-NMR and GPC, with the results shown below.

Copolymer Compositional Ratio monomer b5:monomer a6:monomer c3=48.2:7.2:44.6

Mw=15,200

Dispersity (Mw/Mn)=1.89

This is designated Polymer 13.

Synthesis Example 14

In a 100-ml flask were admitted 13.8 g of monomer b5, 10.3 g of monomer a6, 24.1 g of monomer c4, and 15 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 35.5 g of a white polymer.

The polymer was analyzed by $^{13}$C- and $^1$H-NMR and GPC, with the results shown below.

Copolymer Compositional Ratio monomer b5:monomer a6:monomer c4=43.4:9.5:47.1

Mw=6,800

Dispersity (Mw/Mn)=1.53

This is designated Polymer 14.

Synthesis Example 15

In a 100-ml flask were admitted 13.8 g of monomer b5, 10.3 g of monomer a6, 28.1 g of monomer c5, and 15 g of THF as a solvent. The reactor was cooled to −70° C. in a nitrogen atmosphere, after which deaeration in vacuum and nitrogen flow were repeated three times. After warming to room temperature, 1 g of 2,2'-azobis(2,4-dimethylvaleronitrile) as a polymerization initiator was added. The reactor was heated to 55° C., at which reaction was conducted for 25 hours. The reaction solution was diluted with 70 ml of acetone and poured into 1 liter of isopropyl alcohol for precipitation. The white solid precipitate was collected by filtration and dried in vacuum at 40° C., yielding 31.5 g of a white polymer.

The polymer was analyzed by $^{13}$C- and $^1$H-NMR and GPC, with the results shown below.

Copolymer Compositional Ratio monomer b5:monomer a6:monomer c5=42.4:9.3:48.3

Mw=7,800

Dispersity (Mw/Mn)=1.63

This is designated Polymer 15:

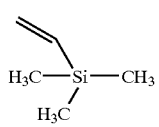

Monomer a1

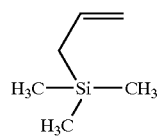

Monomer a2

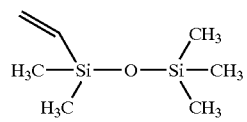

Monomer a3

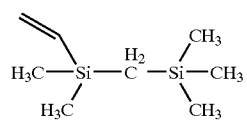

Monomer a4

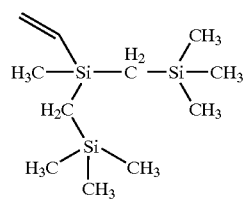

Monomer a5

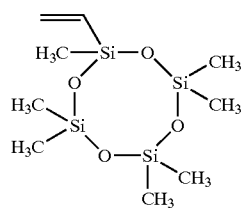

Monomer a6

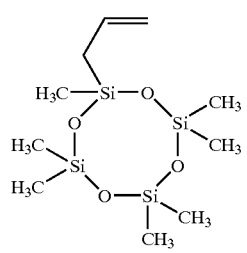

Monomer a7

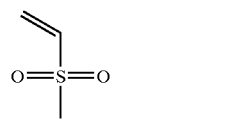

Monomer b1

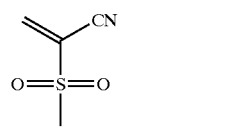

Monomer b2

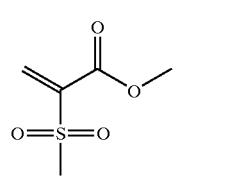

Monomer b3

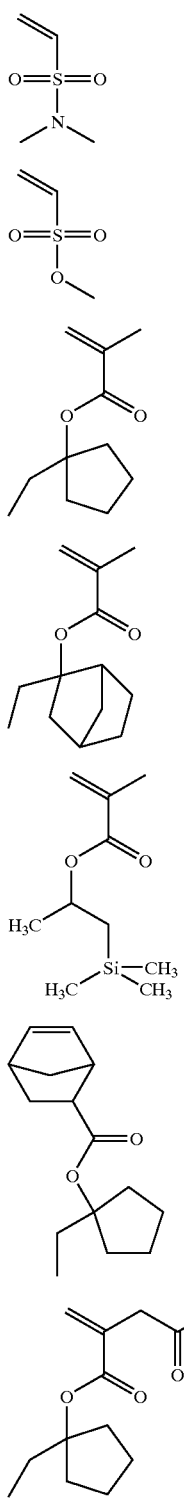

Monomer b4

Monomer b5

Monomer c1

Monomer c2

Monomer c3

Monomer c4

Monomer c5

Dry Etching Test

A polymer solution was prepared by thoroughly dissolving 1 g of each of the polymers (Synthesis Examples 1 to 15) or 3 g of a novolac resin having a m/p ratio of 6/4 and Mw of 8,000 in 10 g of propylene glycol monomethyl ether acetate and passing the solution through a 0.2-micron filter. The polymer solution was spin coated to a silicon wafer and baked at 110° C. for 60 seconds to form a polymer film of 200 nm thick or a novolac film of 1,000 nm thick. The wafer having the polymer film formed thereon was subjected to dry etching under two sets of conditions. A difference in polymer film thickness before and after the etching test was determined.

(1) $O_2$ Etching Test:

Using a dry etching instrument TE-8500P by Tokyo Electron K.K., the polymer films were etched with oxygen gas under the following conditions.

| Chamber pressure | 450 mTorr |
|---|---|
| RF power | 600 W |
| Ar gas flow rate | 40 sccm |
| $O_2$ gas flow rate | 60 sccm |
| Gap | 9 mm |
| Time | 60 sec |

(2) $Cl_2/BCl_3$ Etching Test:

Using a dry etching instrument L-507D-L by Nichiden Anerba K.K., the polymer films were etched with halide gases under the following conditions.

| Chamber pressure | 300 mTorr |
|---|---|
| RF power | 300 W |
| Gap | 9 mm |
| $Cl_2$ gas flow rate | 30 sccm |
| $BCl_3$ gas flow rate | 30 sccm |
| $CHF_3$ gas flow rate | 100 sccm |
| $O_2$ gas flow rate | 2 sccm |
| Time | 60 sec |

The results are shown in Table 1:

TABLE 1

| Polymer | $O_2$ gas etching rate (nm/min) | $Cl_2/BCl_3$ gas etching rate (nm/min) |
|---|---|---|
| Polymer 1 | 342 | 330 |
| Polymer 2 | 350 | 301 |
| Polymer 3 | 330 | 350 |
| Polymer 4 | 366 | 305 |
| Polymer 5 | 355 | 364 |
| Polymer 6 | 383 | 388 |
| Polymer 7 | 320 | 320 |
| Polymer 8 | 335 | 330 |
| Polymer 9 | 302 | 310 |
| Polymer 10 | 280 | 315 |
| Polymer 11 | 289 | 323 |
| Polymer 12 | 260 | 280 |
| Polymer 13 | 180 | 266 |
| Polymer 14 | 253 | 220 |
| Polymer 15 | 266 | 360 |
| Novolak | 8000 | 303 |

Resist Evaluation

Resist solutions were prepared by thoroughly dissolving each of the silicone polymers (Polymers 1 to 15), photoacid generator (PAG1, PAG2) and dissolution inhibitor (DRI1, DRI2) in 1,000 parts by weight of propylene glycol monomethyl ether acetate (PGMEA) containing 0.01% by weight of surfactant FC-430 (Sumitomo 3M Ltd.) in the combination and amounts shown in Table 2, followed by filtration through a 0.2-micron Teflon filter.

A novolac base resist material OFPR-800 (Tokyo Ouka Kogyo K.K.) was applied onto on a silicon wafer and heat cured at 300° C. for 5 minutes to form a lower layer of 0.5

μm thick. An antireflective material DUV-30 (Brewer Science) was spin coated onto the lower layer and baked at 100° C. for 30 seconds and then at 200° C. for 60 seconds, forming an antireflective film of 85 nm thick.

Each resist solution was spin coated onto the cured DUV-30/novolac resist and baked on a hot plate at 110° C. for 60 seconds to form a resist film of 0.2 μm thick. The resist film was exposed using an ArF excimer laser stepper S305B (Nikon Corporation; NA 0.68, σ 0.85, ⅔ annular illumination), then baked (PEB) at 130° C. for 60 seconds, and developed for 60 seconds with a 2.38% aqueous solution of tetramethylammonium hydroxide (TMAH), thereby giving a positive pattern.

The resist pattern was evaluated as follows. The sensitivity of the resist is the optimum exposure (Eop) which provided a 0.15 μm line-and-space pattern in a ratio of 1:1. The resolution is defined as the minimum line width (μm) of the line-and-space pattern that separated at this exposure. The results are shown in Table 2:

TABLE 2

| Polymer (pbw) | Photoacid generator (pbw) | Basic compound (pbw) | Dissolution inhibitor (pbw) | Sensitivity (mJ/cm$^2$) | Resolution (μm) |
|---|---|---|---|---|---|
| Polymer1 (100) | PAG1 (2) | tributylamine (0.1) | — | 28 | 0.11 |
| Polymer2 (100) | PAG1 (2) | tributylamine (0.1) | — | 27 | 0.11 |
| Polymer3 (100) | PAG1 (2) | tributylamine (0.1) | — | 22 | 0.11 |
| Polymer4 (100) | PAG1 (2) | tributylamine (0.1) | — | 24 | 0.11 |
| Polymer5 (100) | PAG1 (2) | tributylamine (0.1) | — | 26 | 0.11 |
| Polymer6 (100) | PAG1 (2) | tributylamine (0.1) | — | 27 | 0.11 |
| Polymer7 (100) | PAG1 (2) | tributylamine (0.1) | — | 25 | 0.11 |
| Polymer8 (100) | PAG1 (2) | tributylamine (0.1) | — | 26 | 0.11 |
| Polymer9 (100) | PAG1 (2) | tributylamine (0.1) | — | 22 | 0.11 |
| Polymer10 (100) | PAG1 (2) | tributylamine (0.1) | — | 20 | 0.11 |
| Polymer11 (100) | PAG1 (2) | tributylamine (0.1) | — | 22 | 0.11 |
| Polymer12 (100) | PAG1 (2) | tributylamine (0.1) | — | 18 | 0.11 |
| Polymer13 (100) | PAG1 (2) | tributylamine (0.1) | — | 25 | 0.11 |
| Polymer14 (100) | PAG1 (2) | tributylamine (0.1) | — | 15 | 0.11 |
| Polymer15 (100) | PAG1 (2) | tributylamine (0.1) | — | 28 | 0.11 |
| Polymer10 (100) | PAG2 (2) | tributylamine (0.1) | — | 35 | 0.11 |
| Polymer10 (100) | PAG1 (2) | TMMEA (0.2) | — | 28 | 0.11 |
| Polymer10 (100) | PAG1 (2) | AAA (0.2) | — | 33 | 0.10 |
| Polymer10 (100) | PAG1 (2) | AACN (0.2) | — | 36 | 0.10 |
| Polymer10 (100) | PAG1 (2) | tributylamine (0.1) | DRI1 (20) | 17 | 0.11 |
| Polymer10 (100) | PAG1 (2) | tributylamine (0.1) | DRI2 (20) | 16 | 0.11 |

TABLE 2-continued

| Polymer (pbw) | Photoacid generator (pbw) | Basic compound (pbw) | Dissolution inhibitor (pbw) | Sensitivity (mJ/cm$^2$) | Resolution (μm) |
|---|---|---|---|---|---|

PAG1

PAG2

DRI1

DRI2

TMMEA

AAA

TABLE 2-continued

| Polymer | Photoacid generator (pbw) | Basic compound (pbw) | Dissolution inhibitor (pbw) | Sensitivity (mJ/cm²) | Resolution (μm) |
|---|---|---|---|---|---|

AACN

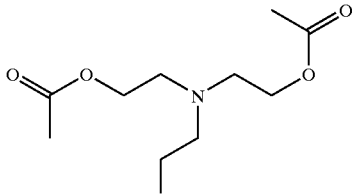

It is seen that the resist compositions comprising silicon-containing polymers of the invention exhibit a high resolution when processed by ArF excimer laser lithography, a higher selectivity ratio than the underlying novolac when etched with oxygen gas, and a high resistance to chlorine gas etching comparable to novolac.

Japanese Patent Application No. 2002-192910 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A silicon-containing polymer comprising recurring units of the general formula (1):

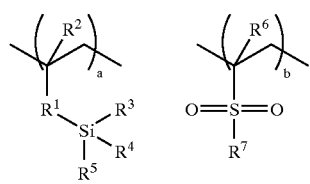

(1)

wherein $R^1$ is a single bond or a straight, branched or cyclic alkylene group of 1 to 10 carbon atoms, $R^2$ is hydrogen or a straight, branched or cyclic alkyl group of 1 to 10 carbon atoms, $R^3$, $R^4$ and $R^5$ are each independently an alkyl or haloalkyl group having 1 to 20 carbon atoms, an aryl group having 6 to 20 carbon atoms or a silicon-containing group which forms a siloxane or silalkylene linkage to the silicon atom in the formula, $R^6$ is hydrogen, methyl, cyano or —C(=O)OR$^8$, $R^8$ is hydrogen, a straight, branched or cyclic alkyl group of 1 to 10 carbon atoms or an acid labile group, $R^7$ is a straight, branched or cyclic alkyl group of 1 to 10 carbon atoms, —NR$^9$R$^{10}$ or —OR$^{11}$, $R^9$ and $R^{10}$ are each independently hydrogen or a straight, branched or cyclic alkyl group of 1 to 10 carbon atoms, $R^{11}$ is a straight, branched or cyclic alkyl group of 1 to 10 carbon atoms, and a and b are positive numbers satisfying $0 < a+b \leq 1$.

2. A silicon-containing polymer comprising recurring units of the general formula (1):

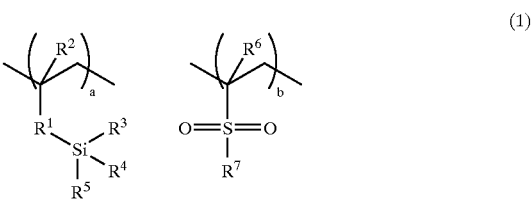

(1)

wherein $R^1$ is a single bond or a straight, branched or cyclic alkylene group of 1 to 10 carbon atoms, $R^2$ is hydrogen or a straight, branched or cyclic alkyl group of 1 to 10 carbon atoms, $R^3$, $R^4$ and $R^5$ are each independently an alkyl or haloalkyl group having 1 to 20 carbon atoms, an aryl group having 6 to 20 carbon atoms or a silicon-containing group which forms a siloxane or silalkylene linkage to the silicon atom in the formula, at least one of $R^3$, $R^4$ and $R^5$ is the silicon-containing group, $R^6$ is hydrogen, methyl, cyano or —C(=O)OR$^8$, $R^8$ is hydrogen, a straight, branched or cyclic alkyl group of 1 to 10 carbon atoms or an acid labile group, $R^7$ is a straight, branched or cyclic alkyl group of 1 to 10 carbon atoms, —NR$^9$R$^{10}$ or —OR$^{11}$, $R^9$, $R^{10}$ and $R^{11}$ are each independently hydrogen or a straight, branched or cyclic alkyl group of 1 to 10 carbon atoms, and a and b are positive numbers satisfying $0 < a+b \leq 1$.

3. The polymer of claim 2 wherein in the recurring units "a" in formula (1), at least one of $R^3$, $R^4$ and $R^5$ is a silicon-containing group which forms a silalkylene linkage to the silicon atom.

4. The polymer of claim 2 wherein in the recurring units "a" in formula (1), at least one of $R^3$, $R^4$ and $R^5$ is a silicon-containing group which forms a siloxane linkage to the silicon atom.

5. A silicon-containing polymer comprising recurring units of the general formula:

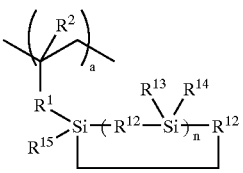

wherein $R^1$ is a single bond or a straight, branched or cyclic alkylene group of 1 to 10 carbon atoms, $R^2$ is hydrogen or a straight, branched or cyclic alkyl group of 1 to 10 carbon atoms, $R^{12}$ is an oxygen atom, a straight, branched or cyclic alkylene group of 1 to 10 carbon atoms, or an arylene group of 6 to 10 carbon atoms, $R^{13}$ to $R^{15}$ are each independently a straight, branched or cyclic alkyl or fluoroalkyl group of 1 to 10 carbon atoms or aryl group, n is an integer of 2 to 10, $R^6$ is hydrogen, methyl, cyano or —C(=O)OR$^8$, $R^8$ is hydrogen, a straight, branched or cyclic alkyl group of 1 to 10 carbon atoms or an acid labile group, $R^7$ is a straight, branched or cyclic alkyl group of 1 to 10 carbon atoms, —NR$^9$R$^{10}$ or —OR$^{11}$, $R^9$, $R^{10}$ and $R^{11}$ are each independently hydrogen or a staight, branched or cyclic alkyl group of 1 to 10 carbon atoms, and a and b are positive numbers satisfying $0<a+b\leq 1$.

6. The polymer of claim 1 wherein the polymer further comprises recurring units "c" containing acid labile groups in addition to the recurring units "a" and "b" of formula (1), the total of recurring units "a," "b" and "c" being 10 to 100 mol % of the polymer, the recurring units "c" being selected from the general formulae (C)-1 to (C)-5:

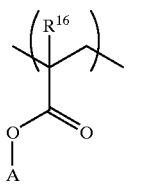
(C)-1

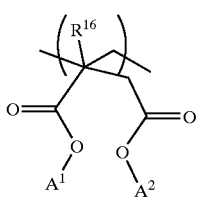
(C)-2

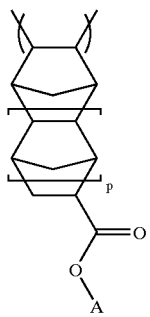
(C)-3

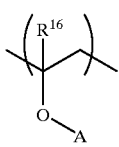
(C)-4

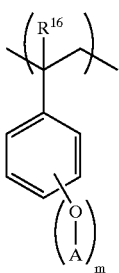
(C)-5 wherein $R^{16}$ is hydrogen, an alkyl group having 1 to 20 carbon atoms, aryl group having 3 to 20 carbon atoms, haloalkyl group having 1 to 20 carbon atoms or cyano group, A is an acid labile group, p is 0 or 1, m is 1 or 2, both or either one of $A^1$ and $A^2$ is an acid labile group, $A^1$ or $A^2$ is hydrogen, an alkyl group having 1 to 20 carbon atoms or adhesive group when it is not an acid labile group.

7. A resist composition comprising a silicon-containing polymer comprising recurring units of the general formula (1):

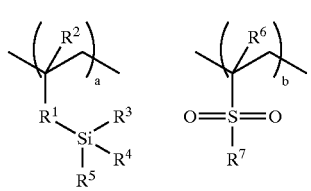
(1)

wherein $R^1$ is a single bond or a straight, branched or cyclic alkylene group of 1 to 10 carbon atoms, $R^2$ is hydrogen or a straight, branched or cyclic alkyl group of 1 to 10 carbon atoms, $R^3$, $R^4$ and $R^5$ are each independently an alkyl or haloalkyl group having 1 to 20 carbon atoms, an aryl group having 6 to 20 carbon atoms or a silicon-containing group which forms a siloxane or silalkylene linkage to the silicon atom in the formula, $R^6$ is hydrogen, methyl, cyano or —C(=O)OR$^8$, $R^8$ is hydrogen, a straight, branched or cyclic alkyl group of 1 to 10 carbon atoms or an acid labile group, $R^7$ is a straight, branched or cyclic alkyl group of 1 to 10 carbon atoms, —NR$^9$R$^{10}$ or —OR$^{11}$, $R^9$, $R^{10}$ and $R^{11}$ are each independently hydrogen or a straight, branched or cyclic alkyl group of 1 to 10 carbon atoms, and a and b are positive numbers satisfying $0<a+b\leq 1$.

8. A chemically amplified, positive resist composition comprising:

(I) a silicon-containing polymer comprising recurring units of the general formula (1):

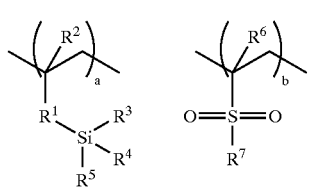
(1)

wherein $R^1$ is a single bond or a straight, branched or cyclic alkylene group of 1 to 10 carbon atoms, $R^2$ is hydrogen or a straight, branched or alkyl group of 1 to 10 carbon atoms, $R^3$, $R^4$ and $R^5$ are each independently an alkyl or haloalkyl group having 1 to 20 carbon atoms, an aryl group having 6 to 20 carbon atoms or a silicon-containing group which forms a siloxane or silalkylene linkage to the silicon atom in the formula, $R^6$ is hydrogen, methyl, cyano or —C(=O)OR$^8$, $R^8$ is hydrogen, a straight, branched or cyclic alkyl group of 1 to 10 carbon atoms or an acid labile group, $R^7$ is a straight, branched or cyclic alkyl group of 1 to 10 carbon atoms, —NR$^9$R$^{10}$ or —OR$^{11}$, $R^9$, $R^{10}$ and $R^{11}$ are each independently hydrogen or a straight, branched or cyclic alkyl group of 1 to 10 carbon atoms, and a and b are positive numbers satisfying $0<a+b\leq 1$, (II) a photoacid generator, and (III) an organic solvent.

9. A chemically amplified, positive resist composition comprising:
   (I) a silicon-containing polymer comprising recurring units of the general formula (1):

(1)

wherein $R^1$ is a single bond or a sraight, branched or cyclic alkylene group of 1 to 10 carbon atoms,
   $R^2$ is hydrogen or a straight, branched or cyclic alkyl group of 1 to 10 carbon atoms,
   $R^3$, $R^4$ and $R^5$ are each independently an alkyl or haloalkyl group having 1 to 20 carbon atoms, an aryl group having 6 to 20 carbon atoms or a silicon-containing group which forms a siloxane or silalkylene linkage to the silicon atom in the formula,
   $R^6$ is hydrogen, methyl, cyano or —C(=O)OR$^8$,
   $R^8$ is hydrogen, a straight, branched or cyclic alkyl group of 1 to 10 carbon atoms or an acid labile group,
   $R^7$ is a straight, branched or cyclic alkyl group of 1 to 10 carbon atoms, —NR$^9$R$^{10}$ or OR$^{11}$,
   $R^9$, $R^{10}$ and $R^{11}$ are each independently hydrogen or a straight, branched or cyclic alkyl group of 1 to 10 carbon atoms, and
   a and b are positive numbers satisfying $0<a+b\leq 1$,
   (II) a photoacid generator,
   (III) an organic solvent, and
   (IV) a dissolution inhibitor.

10. The resist composition of claim 8 further comprising a basic compound.

11. A process for forming a resist pattern comprising the steps of:
   applying the resist composition of claim 7 onto a substrate to form a coating,
   heat treating the coating and then exposing it to high-energy radiation having a wavelength of up to 300 nm or electron beam through a photo mask, and
   optionally heat treating the exposed coating and developing it with a developer.

12. The pattern forming process of claim 11 wherein the substrate bears thereon an underlay on which the coating of the resist composition is formed, said process further comprising the step of treating the underlay by an etching process including oxygen plasma etching, after the resist pattern formation.

13. The pattern forming process of claim 11 wherein the substrate bears thereon an underlay on which the coating of the resist composition is formed, said process further comprising the step of treating the underlay by etching with a halogen gas containing chlorine or bromine, after the resist pattern formation.

14. The polymer of claim 2 wherein the polymer further comprises recurring units "c" containing acid labile groups in addition to the recurring units "a" and "b" of formula (1), the total of recurring units "a," "b" and "c" being 10 to 100 mol % of the polymer,
   the recurring units "c" being selected from the general formulae (C)-1 to (C)-5:

(C)-1

(C)-2

(C)-3

(C)-4

(C)-5 wherein $R^{16}$ is hydrogen, an alkyl group having 1 to 20 carbon atoms, aryl group having 3 to 20 carbon atoms, haloalkyl group having 1 to 20 carbon atoms or cyano group, A is an acid labile group, p is 0 or 1, m is 1 or 2, both or either one of $A^1$ and $A^2$ is an acid labile group, $A^1$ or $A^2$ is hydrogen, an alkyl group having 1 to 20 carbon atoms or adhesive group when it is not an acid labile group.

15. The polymer of claim 5 wherein the polymer further comprises recurring units "c" containing acid labile groups in addition to the recurring units "a" and "b" of formula (1), the total of recurring units "a," "b" and "c" being 10 to 100 mol % of the polymer, the recurring units "c" being selected from the general formulae (C)-1 to (C)-5:

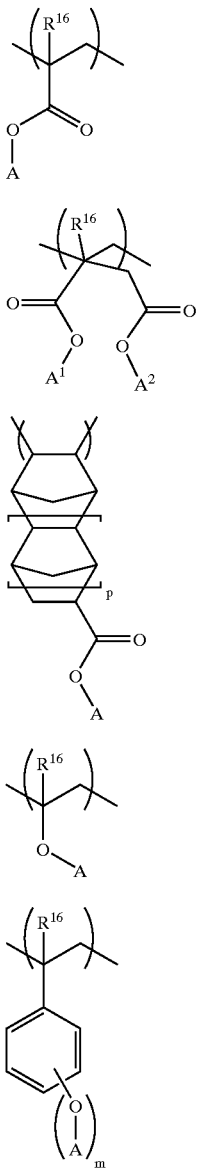

wherein $R^{16}$ is hydrogen, an alkyl group having 1 to 20 carbon atoms, aryl group having 3 to 20 carbon atoms, haloalkyl group having 1 to 20 carbon atoms or cyano group, A is an acid labile group, p is 0 or 1, m is 1 or 2, both or either one of $A^1$ and $A^2$ is an acid labile group, $A^1$ or $A^2$ is hydrogen, an alkyl group having 1 to 20 carbon atoms or adhesive group when it is not an acid labile group.

16. A chemically amplified, positive resist composition comprising (I) the polymer of claim 2, (II) a photoacid generator, and (III) an organic solvent.

17. A chemically amplified, positive resist composition comprising:

(I) the polymer of claim 5, (II) a photoacid generator, and (III) an organic solvent.

18. A process for forming a resist pattern comprising the steps of:

applying the resist composition of claim 16 onto a substrate to form a coating, heat treating the coating and then exposing it to high-energy radiation having a wavelength of up to 300 nm or electron beam through a photo mask, and optionally heat treating the exposed coating and developing it with a developer.

19. A process for forming a resist pattern comprising the steps of:

applying the resist composition of claim 17 onto a substrate to form a coating, heat treating the coating and then exposing it to high-energy radiation having a wavelength of up to 300 nm or electron beam through a photo mask, and optionally heat treating the exposed coating and developing it with a developer.

* * * * *